US012744554B2

(12) United States Patent
Ashida et al.

(10) Patent No.: US 12,744,554 B2
(45) Date of Patent: *Sep. 22, 2026

(54) RADIO FREQUENCY MODULE

(71) Applicant: Murata Manufacturing Co., Ltd., Nagaokakyo (JP)

(72) Inventors: Tetsurou Ashida, Nagaokakyo (JP); Kouhei Jitousho, Nagaokakyo (JP); Tomoya Oda, Nagaokakyo (JP); Shohei Imai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 287 days.

This patent is subject to a terminal disclaimer.

(21) Appl. No.: 18/633,537

(22) Filed: Apr. 12, 2024

(65) Prior Publication Data

US 2024/0348271 A1 Oct. 17, 2024

(30) Foreign Application Priority Data

Apr. 12, 2023 (JP) ................................ 2023-065008

(51) Int. Cl.
*H04B 1/04* (2006.01)
*H01P 5/22* (2006.01)
*H03F 3/24* (2006.01)

(52) U.S. Cl.
CPC ............... *H04B 1/04* (2013.01); *H01P 5/227* (2013.01); *H03F 3/24* (2013.01); *H04B 2001/0408* (2013.01)

(58) Field of Classification Search
CPC ..... H04B 1/04; H04B 2001/0408; H03F 3/24; H03F 2200/111; H03F 1/0288; H03F 3/19; H03F 3/245; H03F 2200/451; H03F 3/195; H03F 3/72; H03F 3/211; H03F 3/68; H01P 5/227
See application file for complete search history.

(56) References Cited

U.S. PATENT DOCUMENTS

2006/0044060 A1* 3/2006 Shiikuma .............. H03F 1/0288 330/124 R
2006/0055458 A1* 3/2006 Shiikuma .............. H03F 1/3276 330/124 R
2006/0114064 A1* 6/2006 Shiikuma .............. H03F 1/0288 330/295
2011/0199156 A1* 8/2011 Hayakawa ............ H03F 1/0288 330/124 R
2012/0235746 A1* 9/2012 Li ........................... H03F 3/193 330/296

(Continued)

*Primary Examiner* — Dominic E Rego
(74) *Attorney, Agent, or Firm* — XSENSUS LLP

(57) ABSTRACT

A radio frequency module includes a carrier amplifier and a peak amplifier. A 90° hybrid circuit is connected to an input end of the carrier amplifier and an input end of the peak amplifier. A coupler is connected to an output end of the carrier amplifier and an output end of the peak amplifier. A control circuit varies a threshold value of a bias voltage of the peak amplifier based on a radio frequency signal input to the 90° hybrid circuit or the carrier amplifier, and a signal indicating a drive level of the carrier amplifier, in which the carrier amplifier and the peak amplifier are included in an integrated circuit. The control circuit is included in an integrated circuit, and the integrated circuit is disposed adjacent to the integrated circuit on a peak amplifier side.

20 Claims, 14 Drawing Sheets

(56) References Cited

U.S. PATENT DOCUMENTS

| | | | | |
|---|---|---|---|---|
| 2019/0181892 | A1* | 6/2019 | Takenaka | H04W 52/362 |
| 2020/0137872 | A1* | 4/2020 | Bombelli | H03F 1/56 |
| 2021/0320625 | A1* | 10/2021 | Hashinaga | H03F 1/0288 |
| 2022/0231638 | A1* | 7/2022 | Hatanaka | H03F 1/0288 |
| 2022/0329209 | A1* | 10/2022 | Hashinaga | H03F 1/0288 |
| 2022/0376658 | A1* | 11/2022 | Hashinaga | H03F 3/195 |

* cited by examiner 1A
90
20A
71A
BIAS CIRCUIT
13a
11
13b
12
BIAS CIRCUIT
102
COUPLER
BIAS CIRCUIT
90° HYBRID CIRCUIT
101
19a
BIAS CIRCUIT
112a
16
17a
18
BIAS CIRCUIT
17b
19b
BIAS CIRCUIT
111
INTEGRATED CIRCUIT
132
112b
131
122
121
DRIVE LEVEL DETECTION CIRCUIT
PEAK BIAS CONTROL CIRCUIT
23A
INTEGRATED CIRCUIT
22A
72A 1B
90
20
71B
INTEGRATED CIRCUIT
11
13
12
BIAS CIRCUIT
BIAS CIRCUIT
102
COUPLER
15
14
101
DRIVE LEVEL DETECTION CIRCUIT
23B
90° HYBRID CIRCUIT
17
16
19
18
BIAS CIRCUIT
BIAS CIRCUIT
132
112
111
122
131
121
PEAK BIAS CONTROL CIRCUIT
INTEGRATED CIRCUIT
22B
72B 1C
102
RFout
20
COUPLER
Carrier
RF4
15
BIAS CIRCUIT
13
23
DRIVE LEVEL DETECTION CIRCUIT
S1
RF3
Carrier
BIAS CIRCUIT
12
14
22
PEAK BIAS CONTROL CIRCUIT
S2
RF7
19
BIAS CIRCUIT
Peak 17
RF6
Peak 16
18
BIAS CIRCUIT
11
90° HYBRID CIRCUIT
RF2
RF5
RF1
101
RFin

1C

90

20

71B

INTEGRATED CIRCUIT

11

13

12

BIAS CIRCUIT

BIAS CIRCUIT

102

COUPLER

15

14

DRIVE LEVEL DETECTION CIRCUIT

23

90° HYBRID CIRCUIT

17

16

19

18

BIAS CIRCUIT

BIAS CIRCUIT

132

112

111

122

131

PEAK BIAS CONTROL CIRCUIT

121

123

101

INTEGRATED CIRCUIT

22

72C 1D
90
20
71B
INTEGRATED CIRCUIT
11
13
12
102
COUPLER
BIAS CIRCUIT
BIAS CIRCUIT
15
14
90° HYBRID CIRCUIT
60
101
DRIVE LEVEL DETECTION CIRCUIT
23
17
16
19
18
BIAS CIRCUIT
BIAS CIRCUIT
132
112
111
122
131
121
PEAK BIAS CONTROL CIRCUIT
124
22
INTEGRATED CIRCUIT
72D 1F
90
20
71F
INTEGRATED CIRCUIT
11
13
12
BIAS CIRCUIT
BIAS CIRCUIT
102
COUPLER
15
14
DRIVE LEVEL DETECTION CIRCUIT
23F
19
18
BIAS CIRCUIT
BIAS CIRCUIT
90° HYBRID CIRCUIT
17
16
134
114
113
126
133
PEAK BIAS CONTROL CIRCUIT
125
123
101
INTEGRATED CIRCUIT
22F
72F

RADIO FREQUENCY MODULE

CROSS-REFERENCE TO RELATED APPLICATION

This application claims the benefit of priority to Japanese application no. 2023-065008, filed Apr. 12, 2023, the entire contents of which are hereby incorporated by reference.

BACKGROUND

1. Field

The present disclosure relates to a radio frequency module.

2. Description of the Related Art

As a highly efficient power amplifier circuit, a Doherty amplifier circuit is known. The Doherty amplifier circuit is generally configured such that a carrier amplifier that operates regardless of a power level of an input signal and a peak amplifier that is turned off when a power level of a radio frequency input signal is low and is turned on when the power level is high are connected in parallel. In the above-described configuration, in a case where the power level of the radio frequency input signal is high, the carrier amplifier operates while maintaining saturation at a saturation output power level. As a result, the Doherty amplifier circuit can improve the efficiency as compared with a normal power amplifier circuit.

In one technique, saturation of a carrier amplifier is detected through a bias circuit of the carrier amplifier, and a bias circuit of a peak amplifier is controlled in response to the detection signal. In another technique, saturation of a carrier amplifier is detected by an output signal of the carrier amplifier, and a bias circuit of a peak amplifier is controlled in response to the detection signal. In a further technique, a bias circuit of a peak amplifier is controlled in response to a radio frequency input signal level input to a Doherty amplifier circuit or a radio frequency input signal level input to a carrier amplifier.

SUMMARY

However, in the above-discussed techniques, the bias circuit of the peak amplifier can be controlled in response to a load fluctuation, but a timing at which the peak amplifier is turned on and off in response to the bias signal may be shifted, and a quality of a radio frequency output signal of the Doherty amplifier circuit may deteriorate. In addition, it is difficult to control the bias circuit of the peak amplifier in response to the load fluctuation, and the quality of the radio frequency output signal output from the Doherty amplifier circuit may deteriorate.

The present disclosure has been made to solve the above problems, and at least one object of the present disclosure to provide a radio frequency module including a Doherty amplifier circuit in which a deterioration in a quality of a radio frequency output signal is suppressed.

An aspect of the present disclosure relates to a radio frequency module including a carrier amplifier and a peak amplifier. A branching circuit connects to an input end of the carrier amplifier and an input end of the peak amplifier, and a synthesis circuit connects to an output end of the carrier amplifier and an output end of the peak amplifier. A control circuit varies a threshold value of a bias voltage of the peak amplifier based on a radio frequency signal input to the branching circuit or the carrier amplifier, and a signal indicating a drive level of the carrier amplifier, in which the carrier amplifier and the peak amplifier are included in a first integrated circuit. The control circuit is included in a second integrated circuit, and the second integrated circuit is disposed adjacent to the first integrated circuit on a peak amplifier side.

Another aspect of the present disclosure relates to a radio frequency module including a carrier amplifier and a peak amplifier. A branching circuit connects to an input end of the carrier amplifier and an input end of the peak amplifier, and a synthesis circuit connects to an output end of the carrier amplifier and an output end of the peak amplifier. A control circuit varies a threshold value of a bias voltage of the peak amplifier, in which a first input end of the control circuit is connected to the input end of the carrier amplifier, a second input end of the control circuit is connected to a bias circuit of the carrier amplifier, an output end of the control circuit is connected to a bias circuit of the peak amplifier. The carrier amplifier and the peak amplifier are included in a first integrated circuit, the control circuit is included in a second integrated circuit, and the second integrated circuit is disposed adjacent to the first integrated circuit on a peak amplifier side.

Still another aspect of the present disclosure relates to a radio frequency module including a carrier amplifier and a peak amplifier. A branching circuit connects to an input end of the carrier amplifier and an input end of the peak amplifier, and a synthesis circuit connects to an output end of the carrier amplifier and an output end of the peak amplifier. A control circuit, in which a first input end of the control circuit is connected to an input end of the branching circuit or the input end of the carrier amplifier, a second input end of the control circuit is connected to the output end of the carrier amplifier, an output end of the control circuit is connected to the peak amplifier. The carrier amplifier and the peak amplifier are included in a first integrated circuit. The control circuit is included in a second integrated circuit, and the second integrated circuit is disposed adjacent to the first integrated circuit on a peak amplifier side.

According to the present disclosure, it is possible to provide the radio frequency module including the Doherty amplifier circuit in which the deterioration in the quality of the radio frequency output signal is suppressed.

DESCRIPTION OF THE PREFERRED EMBODIMENTS

Figure 1:
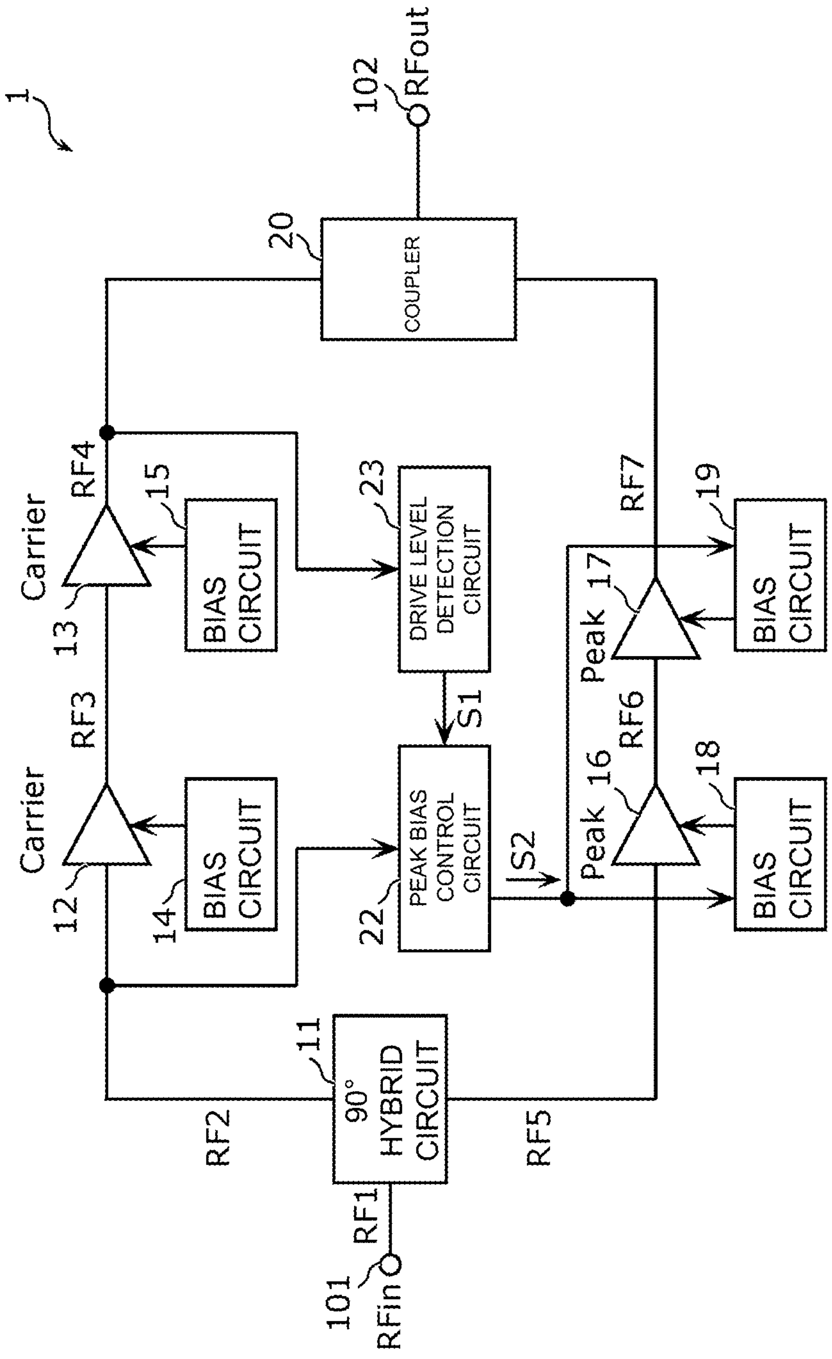
FIG. 1 is a circuit configuration diagram of a radio frequency module according to an exemplary embodiment.

Hereinafter, an exemplary embodiment of the present disclosure will be described in detail with reference to the drawings. All the following exemplary embodiments describe comprehensive or specific examples. Numerical values, shapes, materials, constituent elements, disposition and connection form of constituent elements, and the like shown in the following exemplary embodiment are examples and are not intended to limit the gist of the present.

Each drawing is a schematic diagram in which appropriate emphasis, omission, or adjustment of a ratio is made for the purpose of showing the present disclosure, and is not necessarily strictly shown, and may be different from the actual shape, positional relationship, and ratio. In each drawing, substantially the same configurations are denoted by the same reference numerals, and the duplicate description may be omitted or simplified.

In each drawing, an x-axis and a y-axis are axes that are orthogonal to each other on a plane parallel to a main surface of a substrate. Specifically, in a case where the substrate has a rectangular shape in a plan view, the x-axis is parallel to a first edge of the substrate, and the y-axis is parallel to a second edge of the substrate orthogonal to the first edge. In addition, a z-axis is an axis perpendicular to the main surface of the substrate, and a positive direction thereof indicates an up direction, and a negative direction thereof indicates a down direction.

In the component disposition of the present disclosure, the expression “in a plan view of the substrate” means that an object is viewed in an orthogonal projection from the z-axis positive side to the xy plane. The expression “A overlaps with B in a plan view” means that at least a part of a region of A that is orthogonally projected onto the xy plane overlaps with at least a part of a region of B that is orthogonally projected onto the xy plane. The expression “A is disposed between B and C” means that at least one of a plurality of line segments connecting any point in B and any point in C passes through A.

In the component disposition of the present disclosure, the expression “the component is disposed on the substrate” means that the component is disposed on the main surface of the substrate and that the component is disposed in the substrate. The expression “the component is disposed on the main surface of the substrate” means that the component is disposed above the main surface without making contact with the main surface (for example, the component is laminated on another component disposed while making contact with the main surface), in addition to meaning that the component is disposed while making contact with the main surface of the substrate. The expression “the component is disposed on the main surface of the substrate” may mean that the component is disposed in a recess portion formed in the main surface. The expression “the component is disposed in the substrate” means that the entire component is disposed between both main surfaces of the substrate, but a part of the component is not covered with the substrate, and only a part of the component is disposed in the substrate, in addition to meaning that the component is encapsulated in the module substrate.

In the circuit configuration of the present disclosure, the expression “connected” means a case of being electrically connected through another circuit element, as well as a case of being directly connected by a connection terminal and/or a wiring conductor. The expression “connected between A and B” means that the constituent element is connected to both A and B between A and B.

In addition, in the present disclosure, the expression “the component (element) A is disposed in series in a path B” means that both a signal input end and a signal output end of the component (element) A are connected to a wiring, an electrode, or a terminal constituting the path B.

In addition, in the component disposition of the present disclosure, the expression “A is disposed adjacent to B” means that A and B are disposed in close proximity to each other, and specifically means that no other circuit component is present in a space in which A faces B. Stated another way, the expression “A is disposed adjacent to B” means that none of a plurality of line segments reaching B along a normal direction of a surface from any point on the surface of A facing B passes through the circuit component other than A and B. Here, the circuit component means a component including an active element and/or a passive element. That is, the circuit component includes an active component including a transistor, a diode, or the like, and a passive component including an inductor, a transformer, a capacitor, a resistor, or the like, and does not include an electromechanical component including a terminal, a connector, a wiring, or the like.

In the present disclosure, a “terminal” means an end point of a conductor in an element. In a case where an impedance of the conductor between the elements is sufficiently low, the terminal is interpreted as not only a single point but also any point on the conductor between the elements or the entire conductor.

Furthermore, terms such as “parallel” and “perpendicular”, representing a relationship between elements, a term such as “rectangular” representing the shape of the element, and a numerical value range mean not only their exact meaning but also a substantially equivalent range, for example, the inclusion of an error of about a few percent.

EXEMPLARY EMBODIMENT

1 Circuit Configuration of Radio Frequency Module 1

A circuit configuration of a radio frequency module 1 according to the present exemplary embodiment will be described with reference to FIG. 1. FIG. 1 is a circuit configuration diagram of the radio frequency module 1 according to the exemplary embodiment.

FIG. 1 shows an exemplary circuit configuration, and the radio frequency module 1 may be implemented using any of a variety of circuit implementations and circuit techniques. Therefore, the description of the radio frequency module 1 provided below should not be interpreted restrictively.

As shown in FIG. 1, the radio frequency module 1 includes carrier amplifiers 12 and 13, peak amplifiers 16 and 17, a 90° hybrid circuit 11, a coupler 20, a peak bias control circuit 22, a drive level detection circuit 23, bias circuits 14, 15, 18, and 19, a radio frequency input terminal 101, and a radio frequency output terminal 102. With the above-described configuration, the radio frequency module 1 constitutes a Doherty amplifier circuit.

The Doherty amplifier circuit means an amplifier circuit that realizes high efficiency by using a plurality of amplifier elements as a carrier amplifier and a peak amplifier. The carrier amplifier means an amplifier element that operates regardless of whether a power of a radio frequency input signal is low or high in the Doherty amplifier circuit. The peak amplifier means an amplifier element that mainly operates in a case where the power of the radio frequency input signal is high in the Doherty amplifier circuit. Therefore, in a case where the power of the radio frequency input signal is low, the radio frequency input signal is mainly amplified by the carrier amplifier, and in a case where the power of the radio frequency input signal is high, the radio frequency input signal is amplified and synthesized by the carrier amplifier and the peak amplifier. Due to such an operation, in the Doherty amplifier circuit, a load impedance viewed from the carrier amplifier increases at low output power, and the efficiency at low output power is improved.

The carrier amplifier 12 is a carrier amplifier disposed in the first stage (drive stage), and amplifies the radio frequency input signal input to the carrier amplifier 12. The carrier amplifier 13 is a carrier amplifier disposed in the final stage (power stage), and amplifies the radio frequency input signal input to the carrier amplifier 13.

The carrier amplifiers 12 and 13 are A-class (or AB-class) amplifier circuits that can perform an amplification operation on all power levels of the radio frequency input signals, and particularly, can perform a highly efficient amplification operation in a low output region and a medium output region.

The peak amplifier 16 is a peak amplifier disposed in the first stage (drive stage), and amplifies the radio frequency input signal input to the peak amplifier 16. The peak amplifier 17 is a peak amplifier disposed in the final stage (power stage), and amplifies the radio frequency input signal input to the peak amplifier 17.

The peak amplifiers 16 and 17 are C-class amplifier circuits that can perform an amplification operation in a region in which the power level of the radio frequency input signal is high. In the present exemplary embodiment, the peak amplifiers 16 and 17 are not supplied with a bias voltage (enter in an off state) in a region in which the power level of the radio frequency input signal is low, and are supplied with the bias voltage (enter in an on state) in a region in which the power level of the radio frequency input signal is high. The timing of turning on and off the bias voltage to the peak amplifiers 16 and 17 is controlled by a control signal S2 output from the peak bias control circuit 22.

Amplifier transistors included in the peak amplifiers 16 and 17 may be applied with a bias voltage smaller than a bias current applied to amplifier transistors included in the carrier amplifiers 12 and 13. Therefore, as the power level of the signal input to the peak amplifiers 16 and 17 is higher, the output impedance is lower. As a result, the peak amplifiers 16 and 17 can perform an amplification operation with low distortion in the high output region.

The number of stages of the Doherty amplifier circuit is set to two in the above description, but the present disclosure is not limited thereto. The number of stages of the Doherty amplifier circuit may be one or may be three or more.

The 90° hybrid circuit 11 is an example of the branching circuit, and is connected to the input end of the carrier amplifier 12 and the input end of the peak amplifier 16. The 90° hybrid circuit 11 divides a radio frequency signal RF1 into radio frequency signals RF2 and RF5 having phases different from each other by approximately 90°, outputs the radio frequency signal RF2 to the carrier amplifier 12, and outputs the radio frequency signal RF5 to the peak amplifier 16. The "approximately 90°" includes a phase of 90°+45°, in addition to a phase of 90°.

A preamplifier may be disposed on the input side of the 90° hybrid circuit 11.

The phase of the radio frequency signal RF5 is, for example, delayed by 90° from the radio frequency signal RF2. In addition, for example, the power of the radio frequency signal RF2 is equal to the power of the radio frequency signal RF5.

The bias circuit 14 supplies the bias voltage (and the bias current) to the carrier amplifier 12. The bias circuit 15 supplies the bias voltage (and the bias current) to the carrier amplifier 13. The carrier amplifier 12 amplifies the radio frequency signal RF2 and outputs an amplified radio frequency signal RF3 to the carrier amplifier 13. The carrier amplifier 13 amplifies the radio frequency signal RF3 and outputs an amplified radio frequency signal RF4 to the coupler 20.

The bias circuit 18 supplies the bias voltage (and the bias current) to the peak amplifier 16 based on the control signal S2 output from the peak bias control circuit 22. The bias circuit 19 supplies the bias voltage (and the bias current) to the peak amplifier 17 based on the control signal S2 output from the peak bias control circuit 22. The peak amplifier 16 amplifies the radio frequency signal RF5 and outputs an amplified radio frequency signal RF6 to the peak amplifier 17. The peak amplifier 17 amplifies the radio frequency signal RF6 and outputs an amplified radio frequency signal RF7 to the coupler 20.

The coupler 20 is an example of a synthesis circuit, and is connected to an output end of the carrier amplifier 13 and an output end of the peak amplifier 17 to synthesize the radio frequency signal RF4 and the radio frequency signal RF7. In a case where the radio frequency signal RF4 and the radio frequency signal RF7 are current-synthesized, the coupler 20 has, for example, a phase shifter connected between the carrier amplifier 13 and the radio frequency output terminal 102. The phase shifter delays the radio frequency signal RF4 of the carrier amplifier 13 by 90°. In addition, in a case where the radio frequency signal RF4 and the radio frequency signal RF7 are voltage-synthesized, the coupler 20 has, for example, a phase shifter connected between the peak amplifier 17 and the radio frequency output terminal 102, and a transformer connected to the phase shifter and the output end of the carrier amplifier 13. The transfer shifter delays the radio frequency signal RF7 of the peak amplifier 17 by 90°. In the transformer, for example, both ends of a primary side coil are connected to the output ends of the phase shifter and the carrier amplifier 13, respectively, and both ends of a secondary side coil are connected to the radio frequency output terminal 102 and the ground, respectively.

The drive level detection circuit 23 is connected to the output end of the carrier amplifier 13, and is configured to output a signal S1 indicating a drive level of the carrier amplifier 13 to the peak bias control circuit 22, based on the radio frequency signal RF4 output by the carrier amplifier 13. Accordingly, the drive level detection circuit 23 detects, for example, an instantaneous minimum value of a voltage amplitude (or a current amplitude) of the radio frequency signal RF4. It is determined that the power (amplitude) of the radio frequency signal RF4 is larger as the instantaneous minimum value is smaller.

The drive level detection circuit 23 may be connected to the bias circuit 15 instead of the output end of the carrier amplifier 13, and may be configured to output the signal S1 indicating the drive level of the carrier amplifier 13 to the peak bias control circuit 22.

The signal S1 may be a signal (inversion signal) that is changed in a manner complementary to the drive level of the carrier amplifier 13.

The peak bias control circuit 22 is included in the control circuit, is connected to the input end of the carrier amplifier 12 and the drive level detection circuit 23, and is configured to output the control signal S2 for varying threshold values of the bias voltages of the peak amplifiers 16 and 17 to the bias circuits 18 and 19, based on the radio frequency signal RF2 input to the carrier amplifier 12 and the signal S1 indicating the drive level of the carrier amplifier 13. The threshold value of the bias voltage is a power value of the radio frequency input signal RFin to the radio frequency module 1 when the peak amplifiers 16 and 17 start the amplification operation, and is, for example, a power value of the radio frequency input signal RFin when the supply of the bias voltage to the peak amplifiers 16 and 17 is started (the bias voltage is raised).

The peak bias control circuit 22 may be connected to the input end of the 90° hybrid circuit 11 instead of an input end of the carrier amplifier 12. In this case, the peak bias control circuit 22 is configured to output the control signal S2 for varying the threshold values of the bias voltages of the peak amplifiers 16 and 17 to the bias circuits 18 and 19, based on the radio frequency signal RF1 and the signal S1.

The control signal S2 may be supplied only to the bias circuit 18 among the bias circuits 18 and 19.

2 Bias Control of Peak Bias Control Circuit 22

Figure 2:
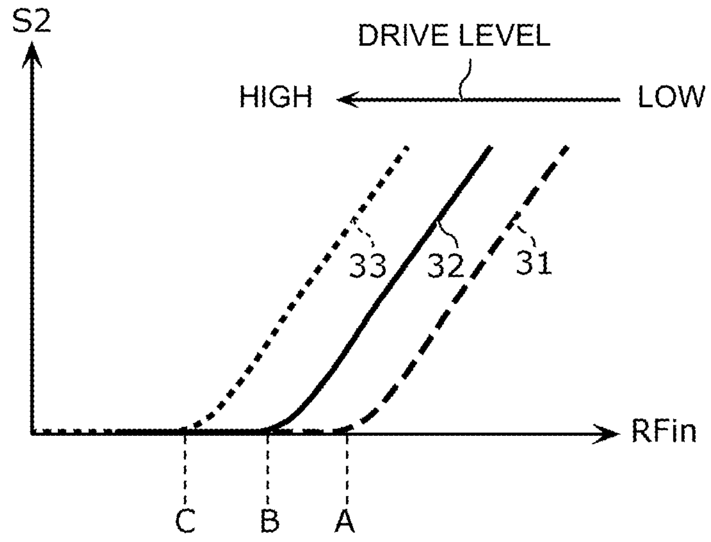
FIG. 2 is a schematic diagram showing an example of a relationship between a radio frequency input signal of the radio frequency module according to the exemplary embodiment and a control signal output by a peak bias control circuit.

FIG. 2 is a schematic diagram showing an example of a relationship between the radio frequency input signal RFin of the radio frequency module 1 according to the exemplary embodiment and the control signal S2 output from the peak bias control circuit 22. In the same drawing, a horizontal axis represents the power of the radio frequency input signal RFin, and a vertical axis represents the intensity (voltage) of the control signal S2 output by the peak bias control circuit 22.

The peak bias control circuit 22 varies a rising point of the control signal S2 in response to the signal S1. A waveform 31 shows a relationship between the power of the radio frequency input signal RFin and the intensity of the control signal S2 in a case where the drive level of the carrier amplifier 13 is relatively low (instantaneous minimum value is relatively large). A waveform 32 shows a relationship between the power of the radio frequency input signal RFin and the intensity of the control signal S2 in a case where the drive level of the carrier amplifier 13 is relatively intermediate (instantaneous minimum value is relatively intermediate). A waveform 33 shows a relationship between the power of the radio frequency input signal RFin and the intensity of the control signal S2 in a case where the drive level of the carrier amplifier 13 is relatively high (instantaneous minimum value is relatively small).

In the present exemplary embodiment, in a case where the intensity (voltage) of the control signal S2 is relatively low, the bias voltage output from the bias circuits 18 and 19 is relatively low, and in a case where the intensity (voltage) of the control signal S2 is relatively high, the bias voltage output from the bias circuits 18 and 19 is relatively high.

In a case where the drive level of the carrier amplifier 13 is relatively low (instantaneous minimum value is relatively large), the peak bias control circuit 22 raises the control signal S2 when the power of the radio frequency input signal RFin reaches a threshold value A, as shown in the waveform 31. In response to this, the bias circuits 18 and 19 make the bias voltage higher as the power of the radio frequency input signal RFin is larger in a range in which the power of the radio frequency input signal RFin is equal to or larger than the threshold value A, for example.

In addition, in a case where the drive level of the carrier amplifier 13 is relatively intermediate (instantaneous minimum value is relatively intermediate), the peak bias control circuit 22 raises the control signal S2 when the power of the radio frequency input signal RFin reaches a threshold value B (B<A), as shown in the waveform 32. In response to this, the bias circuits 18 and 19 make the bias voltage higher as the power of the radio frequency input signal RFin is larger in a range in which the power of the radio frequency input signal RFin is equal to or larger than the threshold value B, for example.

In addition, in a case where the drive level of the carrier amplifier 13 is relatively high (instantaneous minimum value is relatively small), the peak bias control circuit 22 raises the control signal S2 when the power of the radio frequency input signal RFin reaches a threshold value C (C<B) as shown in the waveform 33. In response to this, the bias circuits 18 and 19 make the bias voltage higher as the power of the radio frequency input signal RFin is larger in a range in which the radio frequency input signal RFin is equal to or larger than the threshold value C, for example.

That is, the peak bias control circuit 22 is configured to vary the threshold value of the bias voltage of the peak amplifier 16 and/or the peak amplifier 17 based on the radio frequency signal RF2 (or the radio frequency input signal RFin) and the signal S1 indicating the drive level of the carrier amplifier 13.

For example, in a case where the radio frequency input signal RFin having large power is input, the peak bias control circuit 22 outputs the control signal S2 to the bias circuits 18 and 19 to cause the bias circuits 18 and 19 to output a predetermined bias voltage, thereby activating the peak amplifiers 16 and 17. As a result, it is possible to suppress the saturation of the carrier amplifiers 12 and 13.

The peak bias control circuit 22 according to the present exemplary embodiment detects the radio frequency input signal RFin to perform feedforward control of the bias voltage, and thus the peak bias control circuit 22 can respond much faster than the configuration in the related art in which the saturation of the carrier amplifier is detected. Therefore, even in a case where the power of the radio frequency input signal RFin is increased in a short time, the peak bias control circuit 22 can immediately respond to supply the bias voltage from the bias circuits 18 and 19 to quickly activate the peak amplifiers 16 and 17, and can suppress the momentary saturation of the carrier amplifiers 12 and 13.

It should be noted that, in a case where the temperature and other peripheral environments are changed (for example, a case where the load impedance fluctuates, a case where the gains of the carrier amplifiers 12 and 13 are increased at an extremely low temperature, or the like), the carrier amplifiers 12 and 13 may be saturated even when the power of the radio frequency input signal RFin is small.

On the other hand, in order to be capable of handling the above-described case, the peak bias control circuit 22 according to the present exemplary embodiment detects the signal S1 indicating the drive level of the carrier amplifiers 12 and 13 to perform feedback control of the bias voltage. Therefore, in a case where the carrier amplifiers 12 and 13 are close to saturation, the peak amplifiers 16 and 17 can be activated even when the power of the radio frequency input signal RFin is small.

That is, the peak bias control circuit 22 is configured to vary the threshold values (A, B, and C) of the bias voltages of the peak amplifiers 16 and 17 based on the radio frequency signal RF2 (or the radio frequency input signal RFin) and the signal S1.

Therefore, since the peak bias control circuit 22 according to the present exemplary embodiment detects the radio frequency signal RF2 (or the radio frequency input signal RFin), even when a time is required to detect the drive level of the carrier amplifiers 12 and 13, the peak amplifiers 16 and 17 can be activated by supplying the predetermined bias voltage from the bias circuits 18 and 19 without saturating the carrier amplifiers 12 and 13. As a result, in the radio frequency module 1 including the Doherty amplifier circuit, it is possible to suppress the deterioration in the quality of the radio frequency output signal.

Figure 3:
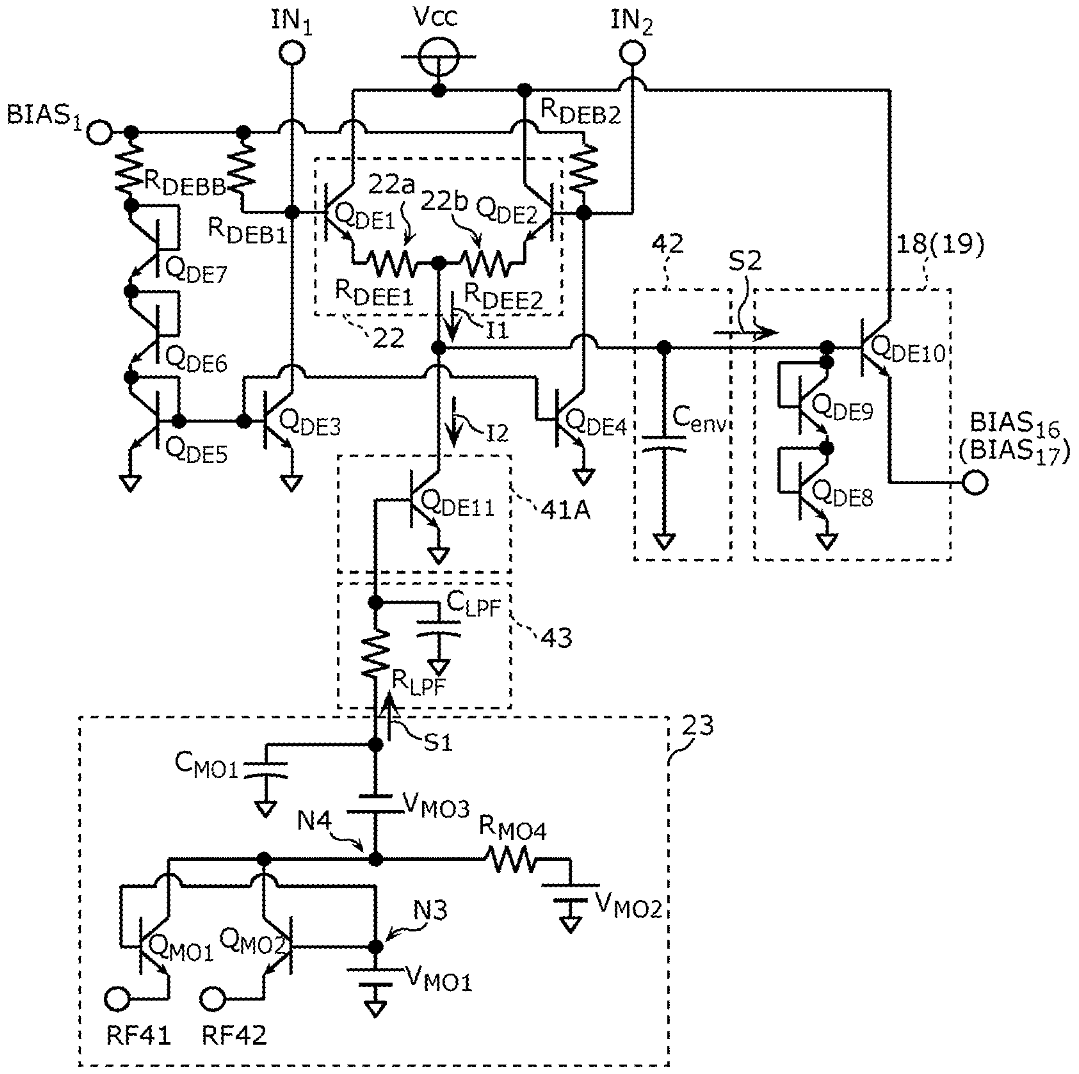
FIG. 3 is a circuit configuration diagram of the peak bias control circuit, a drive level detection circuit, and a bias circuit according to the exemplary embodiment.

3 Circuit Configuration Examples of Peak Bias Control Circuit, Drive Level Detection Circuit, and Bias Circuit Next, circuit configurations of the peak bias control circuit 22, the drive level detection circuit 23, and the bias circuits 18 and 19 according to the present exemplary embodiment will be described. FIG. 3 is a circuit configuration diagram of the peak bias control circuit 22, the drive level detection circuit 23, and the bias circuits 18 and 19 according to the exemplary embodiment. In the same drawing, in addition to the peak bias control circuit 22, the drive level detection circuit 23, the bias circuits 18 and 19, a constant current circuit 41A, and low pass filters 42 and 43 are shown. The constant current circuit 41A, and the low pass filters 42 and 43 need not be provided.

The peak bias control circuit 22 includes transistors $Q_{DE1}$ and $Q_{DE2}$, and resistors $R_{DEE1}$ and $R_{DEE2}$.

In the present disclosure, each transistor is a bipolar transistor, but each transistor is not limited thereto. As the bipolar transistor, a heterojunction bipolar transistor (HBT) is shown, but the present disclosure is not limited thereto. The transistor may be, for example, a field effect transistor (FET). The transistor may be a multi-finger transistor in which a plurality of unit transistors are electrically connected in parallel. The unit transistor refers to a minimum configuration for configuring the transistor.

A collector of the transistor $Q_{DE1}$ is electrically connected to a power source (Vcc). An emitter of the transistor $Q_{DE1}$ is electrically connected to one end of the resistor $R_{DEE1}$. The transistor $Q_{DE1}$ and the resistor $R_{DEE1}$ constitute an emitter follower circuit 22*a*.

The peak bias control circuit 22 may include a source follower circuit instead of the emitter follower circuit 22*a*.

A collector of the transistor $Q_{DE2}$ is connected to the power source (Vcc). An emitter of the transistor $Q_{DE2}$ is connected to one end of the resistor $R_{DEE2}$. The transistor $Q_{DE2}$ and the resistor $R_{DEE2}$ constitute an emitter follower circuit 22*b*.

The peak bias control circuit 22 may include a source follower circuit instead of the emitter follower circuit 22*b*.

The other end of the resistor $R_{DEE1}$ and the other end of the resistor $R_{DEE2}$ are connected to each other. The sum of an output current of the emitter follower circuit 22*a* and an output current of the emitter follower circuit 22*b* is an output current I1 of the peak bias control circuit 22.

Resistors $R_{DEBB}$, $R_{DEB1}$, and $R_{DEB2}$, and transistors $Q_{DE5}$, $Q_{DE6}$, and $Q_{DE7}$ apply the bias voltage to bases of the transistors $Q_{DE1}$ and $Q_{DE2}$.

One end of the resistor $R_{DEBB}$, one end of the resistor $R_{DEB1}$, and one end of the resistor $R_{DEB2}$ are connected to each other.

The other end of the resistor $R_{DEBB}$ is connected to a collector and a base of the transistor $Q_{DE7}$. That is, the transistor $Q_{DE7}$ is diode-connected. An emitter of the transistor $Q_{DE7}$ is connected to a collector and the base of the transistor $Q_{DE6}$. That is, the transistor $Q_{DE6}$ is diode-connected. An emitter of the transistor $Q_{DE6}$ is connected to a collector and a base of the transistor $Q_{DE5}$. That is, the transistor $Q_{DE5}$ is diode-connected. An emitter of the transistor $Q_{DE5}$ is connected to a reference potential. As the reference potential, a ground potential is shown, but the present disclosure is not limited thereto.

A bias current $BIAS_1$ is input to one end of the resistor $R_{DEBB}$, one end of the resistor $R_{DEB1}$, and one end of the resistor $R_{DEB2}$. The resistor $R_{DEBB}$, the transistor $Q_{DE7}$, the transistor $Q_{DE6}$, and the transistor $Q_{DE5}$ generate a constant voltage. This voltage is input to a base of the transistor $Q_{DE1}$ through the resistor $R_{DEB1}$ and is input to a base of the transistor $Q_{DE2}$ through the resistor $R_{DEB2}$.

Each of the transistors $Q_{DE3}$ and $Q_{DE4}$ is connected to the transistor $Q_{DE5}$ by a current mirror. A collector of the transistor $Q_{DE3}$ is connected to the base of the transistor $Q_{DE1}$. As a result, the transistor $Q_{DE3}$ can adjust a base current of the transistor $Q_{DE1}$. A collector of the transistor $Q_{DE4}$ is connected to the base of the transistor $Q_{DE2}$. As a result, the transistor $Q_{DE4}$ can adjust a base current of the transistor $Q_{DE2}$.

In the present circuit configuration example, radio frequency signals $IN_1$ and $IN_2$ obtained by converting the radio frequency signal RF2 into differential signals are input to the base of the transistor $Q_{DE1}$ and the base of the transistor $Q_{DE2}$. The radio frequency signals $IN_1$ and $IN_2$ can be obtained, for example, by inputting the radio frequency signal RF2 to a balun.

The other end of the resistor $R_{DEE1}$ and the other end of the resistor $R_{DEE2}$ are connected to the constant current circuit 41A. The constant current circuit 41A includes a transistor $Q_{DE11}$. The constant current circuit 41A is a current bias circuit of the peak bias control circuit 22.

The drive level detection circuit 23 includes a resistor $R_{MO4}$, constant voltage sources $V_{MO1}$, $V_{MO2}$, and $V_{MO3}$, transistors $Q_{MO1}$ and $Q_{MO2}$, and a capacitor $C_{MO1}$.

In the present circuit configuration example, the carrier amplifier 13 (see FIG. 1) is a differential amplifier and outputs radio frequency signals RF41 and RF42 that constitute a pair of differential signals.

The radio frequency signal RF41 is input to an emitter of the transistor $Q_{MO1}$. The emitter of the transistor $Q_{MO1}$ is connected to an output terminal (collector or drain of an output transistor) of one amplifier in the carrier amplifier 13.

The radio frequency signal RF42 is input to an emitter of the transistor $Q_{MO2}$. The emitter of the transistor $Q_{MO2}$ is connected to an output terminal (collector or drain of an output transistor) of the other amplifier in the carrier amplifier 13.

A base of the transistor $Q_{MO1}$ and a base of the transistor $Q_{MO2}$ are connected to a node N3. A collector of the transistor $Q_{MO1}$ and a collector of the transistor $Q_{MO2}$ are connected to a node N4.

The constant voltage source $V_{MO1}$ applies a voltage to the node N3. That is, the constant voltage source $V_{MO1}$ supplies a bias to the base of the transistor Quoi and the base of the transistor $Q_{MO2}$.

The resistor $R_{MO4}$ and the constant voltage source $V_{MO2}$ apply a voltage to the node N4. That is, the resistor $R_{MO4}$ and the constant voltage source $V_{MO2}$ supply a bias to the collector of the transistor $Q_{MO1}$ and the collector of the transistor $Q_{MO2}$.

One end of the constant voltage source $V_{MO3}$ is connected to the node N4, and the other end of the constant voltage source $V_{MO3}$ is connected to one end of the capacitor $C_{MO1}$. The other end of the capacitor $C_{MO1}$ is connected to the reference potential.

The constant voltage source $V_{MO3}$ outputs the signal S1 from the other end. The capacitor $C_{MO1}$ shunts and smooths a radio frequency component of the signal S1.

Each of the constant voltage sources $V_{MO1}$ and $V_{MO2}$ need only be configured with the resistor and the transistor, and need only be configured to output a substantially constant voltage. The constant voltage source $V_{MO3}$ need only be configured with a diode-connected transistor and need only generate an approximately constant voltage drop.

The constant current circuit 41A includes a transistor $Q_{DE11}$.

The low pass filter 43 includes a resistor $R_{LPF}$ and a capacitor $C_{LPF}$. One end of the resistor $R_{LPF}$ is connected to the other end of the constant voltage source $V_{MO3}$. The other end of the resistor $R_{LPF}$ is connected to one end of the capacitor $C_{LPF}$ and a base of the transistor $Q_{DE11}$. The other end of the capacitor $C_{LPF}$ is connected to the reference potential. The low pass filter 43 allows the signal S1 to pass in a low range and outputs the signal to the base of the transistor $Q_{DE11}$.

The low pass filter 42 includes a capacitor $C_{env}$. One end of the capacitor $C_{env}$ is electrically connected to the other end of the resistor $R_{DEE1}$, the other end of the resistor $R_{DEE2}$, and the collector of the transistor $Q_{DE11}$. The other end of the capacitor $C_{env}$ is connected to the reference potential.

The capacitor $C_{env}$ is charged or discharged by a difference between the output current I1 of the peak bias control circuit 22 and a collector current I2 of the transistor $Q_{DE11}$. The voltage of the capacitor $C_{env}$ is the control signal S2 (voltage). The capacitor $C_{env}$ terminates and removes a radio frequency component (for example, a carrier frequency signal component) of the control signal S2 at the reference potential and allows only the low frequency component to pass. As a result, the capacitor $C_{env}$ can be appropriately biased by the bias circuits 18 and 19 on a subsequent stage and a bias supply target transistor (amplifier transistor).

The bias circuit 18 includes transistors $Q_{DE8}$, $Q_{DE9}$, and $Q_{DE10}$. The circuit configuration of the bias circuit 19 (see FIG. 1) is the same as the circuit configuration of the bias circuit 18, and thus the description thereof will be omitted.

The transistor $Q_{DE9}$ is diode-connected. A collector and a base of the transistor $Q_{DE9}$ are electrically connected to one end of the capacitor $C_{env}$. An emitter of the transistor $Q_{DE9}$ is connected to a collector and a base of the transistor $Q_{DE8}$. The transistor $Q_{DE8}$ is diode-connected. An emitter of the transistor $Q_{DE8}$ is connected to the reference potential. A current corresponding to the voltage of the capacitor $C_{env}$ flows through the transistors $Q_{DE9}$ and $Q_{DE8}$.

A collector of the transistor $Q_{DE10}$ is connected to the power source (Vcc). A base of the transistor $Q_{DE10}$ is connected to the collector and the base of the transistor $Q_{DE9}$. An emitter voltage of the transistor $Q_{DE10}$ is output to the peak amplifier 16 (17) as the bias voltage $BIAS_{16}$ ($BIAS_{17}$).

Hereinafter, the operations of the drive level detection circuit 23 and the peak bias control circuit 22 will be described.

An output end voltage of the carrier amplifier 13 in the final stage vibrates about the bias voltage with the voltage amplitude of the radio frequency signal RF4. When the carrier amplifiers 13 are saturated, a situation occurs in which the voltage amplitude of the radio frequency signal RF4 is increased to be substantially equal to the bias voltage. In this case, an instant in which the instantaneous minimum value of the radio frequency signal RF4 approaches 0 V occurs. This instant is an instant in which the amplification effect is not obtained, and is associated with the phenomenon of saturation of the amplifier. In the present circuit configuration example, the drive level of the carrier amplifier 13 is detected by using the saturation principle.

Specifically, within periods of the radio frequency signals RF41 and RF42, the transistors $Q_{MO1}$ and $Q_{MO2}$ are in an on state only in a period in which the voltages of the radio frequency signals RF41 and RF42 are lower than the voltage obtained by subtracting the voltage drop by the threshold voltage of the transistors $Q_{MO1}$ and $Q_{MO2}$ from the voltage of the constant voltage source $V_{MO1}$.

When the carrier amplifier 13 operates with sufficient margin with respect to the saturation, there is no period in which the transistors $Q_{MO1}$ and $Q_{MO2}$ are in an on state, and thus no collector current flows. Therefore, no current flows through the resistor $R_{MO4}$, and thus no voltage drop is generated. Therefore, the signal S1 is a voltage obtained by subtracting the voltage of the constant voltage source $V_{MO3}$ from the voltage of the constant voltage source $V_{MO2}$.

On the other hand, when the amplitudes of the radio frequency signals RF41 and RF42 are increased, the transistors $Q_{MO1}$ and $Q_{MO2}$ are in an on state for a certain period, and thus the collector current flows. Therefore, the current flows through the resistor $R_{MO4}$, and thus the voltage drop is generated.

When the amplitudes of the radio frequency signals RF41 and RF42 are further increased, the period in which the transistors $Q_{MO1}$ and $Q_{MO2}$ are in an on state is lengthened, and thus a larger collector current flows. Therefore, a larger current flows through the resistor $R_{MO4}$, and thus a larger voltage drop is generated.

Therefore, the signal S1 is a voltage in which the radio frequency signals RF41 and RF42 are smaller by the voltage drop in the resistor $R_{MO4}$ from the voltage at the time of the small signal as the drive level of the carrier amplifier 13 is higher. The signal S1 can be regarded as a signal (inversion signal) that is changed in a manner complementary to the drive level of the carrier amplifier 13.

On the other hand, in the peak bias control circuit 22, the transistor $Q_{DE1}$ is in an on state when the radio frequency signal IN is equal to or larger than the threshold voltage of the transistor $Q_{DE1}$, and outputs the emitter current. The transistor $Q_{DE2}$ is in an on state when the radio frequency signal $IN_2$ is equal to or larger than the threshold voltage of the transistor $Q_{DE2}$, and outputs an emitter current. That is, as the amplitudes of the radio frequency signals $IN_1$ and $IN_2$ (radio frequency signals RF2) are larger, the output current of the peak bias control circuit 22 is larger. In addition, as the amplitudes of the radio frequency signals $IN_1$ and $IN_2$ (radio frequency signals RF2) are smaller, the output current of the peak bias control circuit 22 is smaller.

In addition, as described in the operation of the drive level detection circuit 23, the signal S1 is smaller as the drive level of the carrier amplifier 13 is higher, and is larger as the drive level of the carrier amplifier 13 is higher.

That is, as the drive level of the carrier amplifier 13 is relatively higher (closer to saturation), the collector current I2 of the transistor $Q_{DE11}$ is smaller. In addition, as the drive level of the carrier amplifier 13 is relatively lower (amplification rate is lower), the collector current I2 of the transistor $Q_{DE1}$ is larger.

In a case where the above description is comprehensively considered, the voltage of the capacitor $C_{env}$ is likely to be larger as the drive level of the carrier amplifier 13 is relatively higher (closer to saturation). The voltage of the capacitor $C_{env}$ is less likely to be larger as the drive level of the carrier amplifier 13 is relatively lower (the amplification rate is lower). The voltage of the capacitor $C_{env}$ is likely to be larger as the power of the radio frequency signal RF2 is larger. The voltage of the capacitor $C_{env}$ is less likely to be larger as the power of the radio frequency signal RF2 is smaller.

The peak bias control circuit 22 raises the control signal S2 when the power of the radio frequency input signal RFin reaches the threshold value C in a case where the drive level of the carrier amplifier 13 is relatively high (instantaneous minimum value is relatively small), and raises the control signal S2 when the power of the radio frequency input signal RFin reaches the threshold value A larger than the threshold value C in a case where the drive level of the carrier amplifier 13 is relatively low (instantaneous minimum value is relatively large).

4 Implementation Example of Radio Frequency Module 1 According to the Exemplary Embodiment Next, an implementation example of the radio frequency module 1 configured as described above will be described with reference to FIGS. 4A and 4B.

Figure 4A:
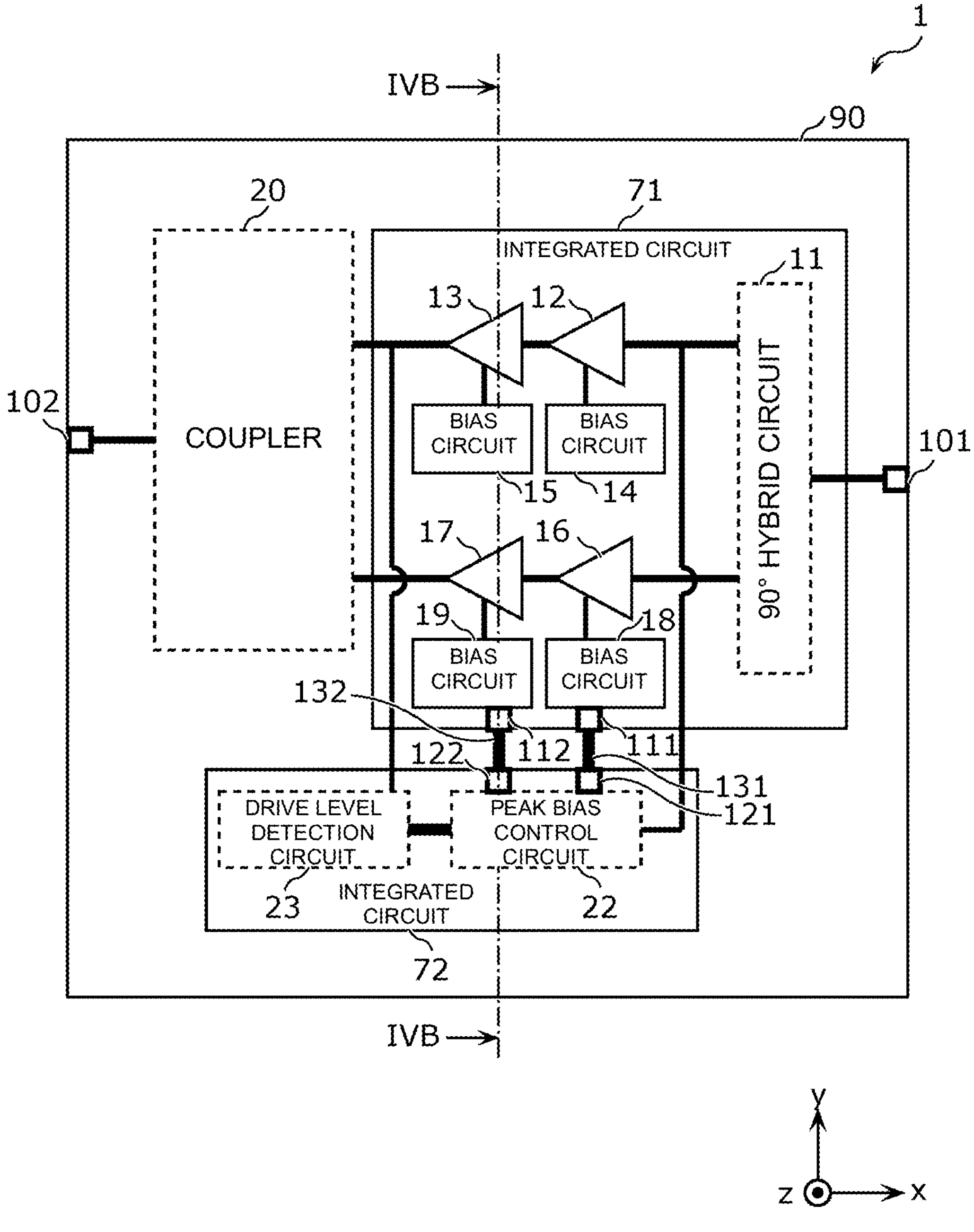
FIG. 4A is a plan view of the radio frequency module according to the exemplary embodiment.
Figure 4B:
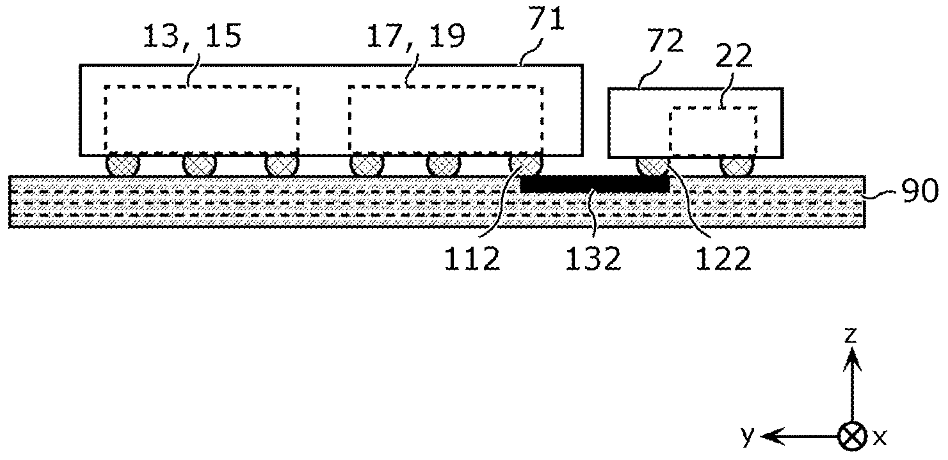
FIG. 4B is a cross-sectional view of the radio frequency module according to the exemplary embodiment.

FIG. 4A is a plan view of the radio frequency module 1 according to the exemplary embodiment. FIG. 4B is a cross-sectional view of the radio frequency module 1 according to the exemplary embodiment. FIG. 4A is a view of a main surface of a module substrate 90 as seen from the z-axis positive side. The cross section of the radio frequency module 1 in FIG. 4B is a cross section taken along the line IVB-IVB in FIG. 4A.

In FIGS. 4A and 4B, a part of wirings for connecting a plurality of circuit components disposed on the module substrate 90 is not shown. In FIGS. 4A and 4B, a resin member that covers the plurality of circuit components and a shield electrode layer that covers a surface of the resin member are not shown. The resin member and the shield electrode layer need not be provided.

As shown in FIG. 4A, the radio frequency module 1 includes the module substrate 90, integrated circuits 71 and 72, a coupler 20, a radio frequency input terminal 101, and a radio frequency output terminal 102. The integrated circuits 71 and 72 are disposed on the main surface of the module substrate 90.

The module substrate 90 has a first main surface and a second main surface facing each other. A ground electrode layer or the like is formed in the module substrate 90 and on the main surface. In addition, in FIG. 4A, the module substrate 90 has a rectangular shape in a plan view, but the shape of the module substrate 90 is not limited thereto.

As the module substrate 90, for example, a low temperature co-fired ceramics (LTCC) substrate or a high temperature co-fired ceramics (HTCC) substrate having a laminated structure of a plurality of dielectric layers, a component-embedded substrate, a substrate having a redistribution layer (RDL), a printed board, or the like can be used, but the module substrate 90 is not limited thereto.

The integrated circuit 71 is an example of a first integrated circuit, and includes the carrier amplifiers 12 and 13, the peak amplifiers 16 and 17, the bias circuits 14, 15, 18, and 19, and the 90° hybrid circuit 11. The integrated circuit 71 need not include the bias circuits 14, 15, 18, and 19, and the 90° hybrid circuit 11.

The integrated circuit 72 is an example of a second integrated circuit and includes a control circuit. In addition, in the present implementation example, the control circuit includes the peak bias control circuit 22 and the drive level detection circuit 23.

In FIG. 4A, each of the integrated circuits 71 and 72 has a rectangular shape in a plan view of the module substrate 90, but the shapes of the integrated circuits 71 and 72 are not limited thereto.

The integrated circuit 71 is formed of, for example, at least one of GaAs, SiGe, and GaN. The integrated circuit 71 is configured using Si or a complementary metal oxide semiconductor (CMOS), and may be specifically manufactured through a silicon on insulator (SOI) process.

The integrated circuit 72 is configured using, for example, Si or CMOS, and may be specifically manufactured through an SOI process. The integrated circuit 72 may be formed of the same material as the integrated circuit 71. The constituent materials of the integrated circuits 71 and 72 are not limited to the above example.

The integrated circuit 71 including the carrier amplifiers 12 and 13, and the peak amplifiers 16 and 17 may be formed of GaAs, SiGe, or GaN, and the integrated circuit 72 including the peak bias control circuit 22 and the drive level detection circuit 23 may be formed of Si or CMOS. Therefore, it is possible to improve the amplification performance of the Doherty amplifier circuit by the integrated circuit 71 and to provide the integrated circuit 72 at low cost and in a versatile manner.

Here, as shown in FIG. 4A, the integrated circuit 72 is disposed adjacent to the integrated circuit 71 on the peak amplifier 16 and 17 side out of the carrier amplifiers 12 and 13, and the peak amplifiers 16 and 17.

Stated another way, the integrated circuit 72 is disposed adjacent to the integrated circuit 71 on the main surface of the module substrate 90, and is disposed closer to the peak amplifiers 16 and 17 than the carrier amplifiers 12 and 13 in a plan view of the module substrate 90.

With the above-described configuration, since the peak amplifiers 16 and 17 and the peak bias control circuit 22 can be disposed in close proximity to each other, the wirings 131 and 132 that connect the peak amplifier 16 (bias circuit 18 thereof) and the peak amplifier 17 (bias circuit 19 thereof) to the peak bias control circuit 22 can be shortened, and the parasitic capacitance of the wirings 131 and 132 can be reduced. Accordingly, since it is possible to suppress the deterioration in the control signal S2 flowing through the wirings 131 and 132, it is possible to control the threshold values of the bias voltages supplied to the peak amplifiers 16 and 17 with high accuracy, and it is possible to suppress the deterioration in the quality of the radio frequency signal output from the radio frequency module 1.

The integrated circuit 71 includes terminals 111 and 112 exposed on an outer surface of the integrated circuit 71. The terminal 111 is an example of a first external connection terminal, and is connected to the bias circuit 18 of the peak amplifier 16 and a terminal 121. The terminal 112 is an example of a first external connection terminal, and is connected to the bias circuit 19 of the peak amplifier 17 and a terminal 122. In the present exemplary embodiment, the terminals 111 and 112 are disposed on a rear surface of the integrated circuit 71 facing the main surface of the module substrate 90.

The integrated circuit 72 includes the terminals 121 and 122 exposed on an outer surface of the integrated circuit 72. The terminal 121 is an example of a second external connection terminal, and is connected to the peak bias control circuit 22 and the terminal 111. The terminal 122 is an example of a second external connection terminal, and is connected to the peak bias control circuit 22 and the terminal 112. In the present exemplary embodiment, the terminals 121 and 122 are disposed on a rear surface of the integrated circuit 72 facing the main surface of the module substrate 90.

Each of the integrated circuits 71 and 72 has a rectangular shape in a plan view of the module substrate 90, and in a plan view of the module substrate 90, a virtual straight line connecting the terminal 111 and the terminal 121 and a virtual straight line connecting the terminal 112 and the terminal 122 are perpendicular to outer edges of the integrated circuits 71 and 72, which face each other in closest proximity to each other.

Therefore, it is possible to minimize the distance between the terminal 111 and the terminal 121 and the distance between the terminal 112 and the terminal 122.

Further, as shown in FIGS. 4A and 4B, the wiring 131 (first wiring) that connects the terminal 111 and the terminal 121, and the wiring 132 (first wiring) that connects the terminal 112 and the terminal 122 are each formed in a linear shape on the module substrate 90.

Therefore, it is possible to minimize each of the wirings 131 and 132, and it is possible to suppress the deterioration in the control signal S2 flowing through the wirings 131 and 132.

As shown in FIG. 4A, the drive level detection circuit 23 and the peak bias control circuit 22 are disposed adjacent to each other in the integrated circuit 72.

Therefore, since a wiring that connects the drive level detection circuit 23 and the peak bias control circuit 22 can be shortened, the signal S1 can be transmitted at a high speed and with a low loss.

5 Circuit Configuration of Radio Frequency Module 1A According to Modification Example 1

Figure 5:
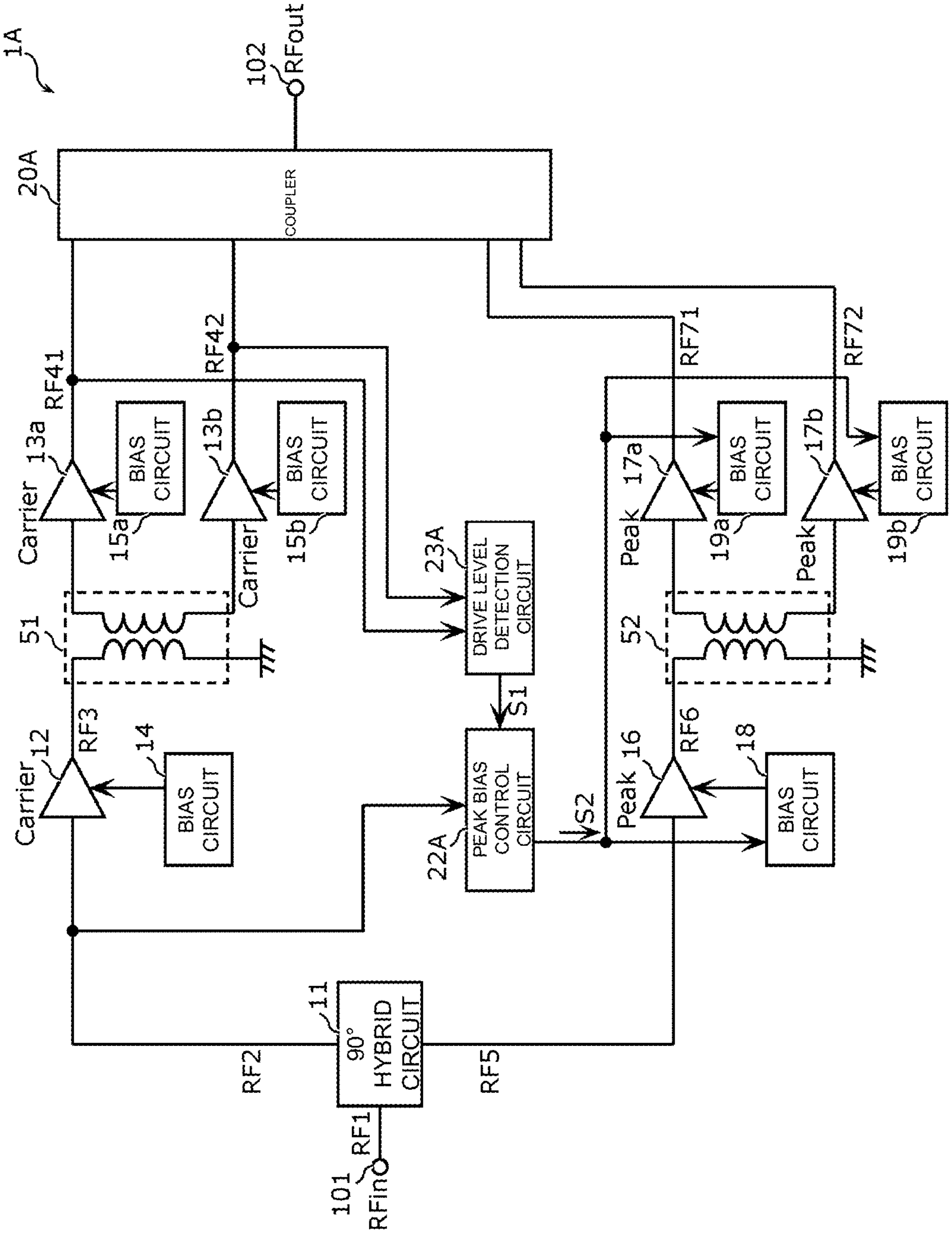
FIG. 5 is a circuit configuration diagram of a radio frequency module according to Modification Example 1 of the exemplary embodiment.

FIG. 5 is a circuit configuration diagram of a radio frequency module 1A according to Modification Example 1 of the exemplary embodiment. The radio frequency module 1A according to the present modification example includes carrier amplifiers 12, 13*a*, and 13*b*, peak amplifiers 16, 17*a*, and 17*b*, the 90° hybrid circuit 11, a coupler 20A, a peak bias control circuit 22A, a drive level detection circuit 23A, bias circuits 14, 15*a*, 15*b*, 18, 19*a*, and 19*b*, transformers 51 and 52, the radio frequency input terminal 101, and the radio frequency output terminal 102. With the above-described configuration, the radio frequency module 1A constitutes a Doherty amplifier circuit. The radio frequency module 1A according to the present modification example is different from the radio frequency module 1 according to the exemplary embodiment in that each of the carrier amplifier and the peak amplifier in the final stage (power stage) is a differential amplifier. Hereinafter, the radio frequency module 1A according to the present modification example will be described, and the same configuration as the configuration of the radio frequency module 1 according to the exemplary embodiment will not be described, and a different configuration will be mainly described.

The carrier amplifier 12 is a carrier amplifier disposed in the first stage (drive stage), and amplifies the radio frequency signal RF2 input to the carrier amplifier 12. The carrier amplifier 13*a* is an example of a first amplifier, and is a carrier amplifier disposed in the final stage (power stage). The carrier amplifier 13*b* is an example of a second amplifier, and is a carrier amplifier disposed in the final stage (power stage). The carrier amplifiers 13*a* and 13*b* are connected in parallel between the 90° hybrid circuit 11 and the coupler 20A to constitute a differential amplifier.

The transformer 51 has a primary side coil and a secondary side coil, and converts an unbalanced signal input to one end of the primary side coil into a balanced signal, and outputs the balanced signal from both ends of the secondary side coil. Specifically, one end of the primary side coil is connected to the output end of the carrier amplifier 12, the other end of the primary side coil is connected to the reference potential, one end of the secondary side coil is connected to the input end of the carrier amplifier 13*a*, and the other end of the secondary side coil is connected to the input end of the carrier amplifier 13*b*.

The output end of the carrier amplifier 13*a* and the output end of the carrier amplifier 13*b* are connected to the coupler 20A.

The carrier amplifiers 12, 13*a*, and 13*b* are A-class (or AB-class) amplifier circuits that can perform an amplification operation on all power levels of the radio frequency input signals, and particularly, can perform a highly efficient amplification operation in a low output region and a medium output region.

The peak amplifier 16 is a peak amplifier disposed in the first stage (drive stage), and amplifies the radio frequency signal RF5 input to the peak amplifier 16. The peak amplifiers 17*a* and 17*b* are peak amplifiers disposed in the final stage (power stage). The peak amplifiers 17*a* and 17*b* are connected in parallel between the 90° hybrid circuit 11 and the coupler 20A to constitute a differential amplifier.

The transformer 52 has a primary side coil and a secondary side coil, and converts an unbalanced signal input to one end of the primary side coil into a balanced signal, and outputs the balanced signal from both ends of the secondary side coil. Specifically, one end of the primary side coil is connected to the output end of the peak amplifier 16, the other end of the primary side coil is connected to the reference potential, one end of the secondary side coil is connected to the input end of the peak amplifier 17*a*, and the other end of the secondary side coil is connected to the input end of the peak amplifier 17*b*.

The output end of the peak amplifier 17*a* and the output end of the peak amplifier 17*b* are connected to the coupler 20A.

The peak amplifiers 16, 17*a*, and 17*b* are C-class amplifier circuits that can perform an amplification operation in a region in which the power level of the radio frequency input signal is high. In the present modification example, the peak amplifiers 16, 17*a*, and 17*b* are not supplied with a bias voltage (enter in an off state) in a region in which the power level of the radio frequency input signal is low, and are supplied with the bias voltage (enter in an on state) in a region in which the power level of the radio frequency input signal is high. The timing of turning on and off the bias voltage to the peak amplifiers 16, 17*a*, and 17*b* is controlled by the control signal S2 output from the peak bias control circuit 22A.

The amplifier transistors included in the peak amplifiers 16, 17*a*, and 17*b* may be applied with the bias voltage smaller than the bias current applied to the amplifier transistors included in the carrier amplifiers 12, 13*a*, and 13*b*. Therefore, as the power levels of the signals input to the peak amplifiers 16, 17*a*, and 17*b* are higher, the output impedance is lower. As a result, the peak amplifiers 16, 17*a*, and 17*b* can perform an amplification operation with low distortion in the high output region.

The number of stages of the Doherty amplifier circuit is set to two in the above description, but the present disclosure is not limited thereto. The number of stages of the Doherty amplifier circuit may be one or may be three or more.

The bias circuit 14 supplies the bias voltage (and the bias current) to the carrier amplifier 12. The bias circuit 15*a* supplies the bias voltage (and the bias current) to the carrier amplifier 13*a*. The bias circuit 15*b* supplies the bias voltage (and the bias current) to the carrier amplifier 13*b*.

The carrier amplifier 12 amplifies the radio frequency signal RF2 and outputs the amplified radio frequency signal RF3 to the transformer 51. The transformer 51 converts the unbalanced radio frequency signal RF3 into the balanced radio frequency signal. The carrier amplifier 13*a* amplifies one of the balanced radio frequency signals and outputs the amplified radio frequency signal RF41 to the coupler 20A. The carrier amplifier 13*b* amplifies the other of the balanced radio frequency signals and outputs the amplified radio frequency signal RF42 to the coupler 20A.

The bias circuit 18 supplies the bias voltage (and the bias current) to the peak amplifier 16 based on the control signal S2 output from the peak bias control circuit 22A. The bias circuit 19*a* supplies the bias voltage (and the bias current) to the peak amplifier 17*a* based on the control signal S2 output from the peak bias control circuit 22A. The bias circuit 19*b* supplies the bias voltage (and the bias current) to the peak amplifier 17*b* based on the control signal S2 output from the peak bias control circuit 22A.

The peak amplifier 16 amplifies the radio frequency signal RF5 and outputs the amplified radio frequency signal RF6 to the transformer 52. The transformer 52 converts the unbalanced radio frequency signal RF6 into the balanced radio frequency signal. The peak amplifier 17*a* amplifies one of the balanced radio frequency signals and outputs an amplified radio frequency signal RF71 to the coupler 20A. The peak amplifier 17*b* amplifies the other of the balanced radio frequency signals and outputs an amplified radio frequency signal RF72 to the coupler 20A.

The coupler 20A is an example of a synthesis circuit, is connected to the output end of the carrier amplifier 13*a*, the output end of the carrier amplifier 13*b*, the output end of the peak amplifier 17*a*, and the output end of the peak amplifier 17*b*, and synthesizes the radio frequency signals RF41, RF42, RF71, and RF72.

The drive level detection circuit 23A is connected to the output ends of the carrier amplifiers 13*a* and 13*b*, and is configured to output the signal S1 indicating the drive level of the carrier amplifiers 13*a* and 13*b* to the peak bias control circuit 22A, based on the radio frequency signal RF41 output by the carrier amplifier 13*a* and the radio frequency signal RF42 output by the carrier amplifier 13*b*. Accordingly, the drive level detection circuit 23A detects, for example, the instantaneous minimum value of the voltage amplitude (or the current amplitude) of the radio frequency signals RF41 and RF42. As the instantaneous minimum value is smaller, the power (amplitude) of the radio frequency signals RF41 and RF42 is determined to be larger.

The drive level detection circuit 23A may be connected to the bias circuit 15*a* instead of the output end of the carrier amplifier 13*a*, may be connected to the bias circuit 15*b* instead of the output end of the carrier amplifier 13*b*, and may be configured to output the signal S1 indicating the drive level of the carrier amplifiers 13*a* and 13*b* to the peak bias control circuit 22A.

The signal S1 may be a signal (inversion signal) that is changed in a manner complementary to the drive levels of the carrier amplifiers 13*a* and 13*b*.

The peak bias control circuit 22A is included in the control circuit, is connected to the input end of the carrier amplifier 12 and the drive level detection circuit 23A, and is configured to output the control signal S2 for varying the threshold values of the bias voltages of the peak amplifiers 16, 17*a*, and 17*b* to the bias circuits 18, 19*a*, and 19*b*, based on the radio frequency signal RF2 input to the carrier amplifier 12 and the signal S1 indicating the drive level of the carrier amplifiers 13*a* and 13*b*.

The peak bias control circuit 22A may be connected to the input end of the 90° hybrid circuit 11 instead of an input end of the carrier amplifier 12. In this case, the peak bias control circuit 22A is configured to output the control signal S2 for varying the threshold values of the bias voltages of the peak amplifiers 16, 17*a*, and 17*b* to the bias circuits 18, 19*a*, and 19*b*, based on the radio frequency signal RF1 and the signal S1.

The control signal S2 may be supplied only to the bias circuit 18 among the bias circuits 18, 19*a*, and 19*b*.

The peak bias control circuit 22A varies the rising point of the control signal S2 in response to the signal S1, as in the graph showing the relationship between the radio frequency input signal RFin and the control signal S2 shown in FIG. 2. That is, the peak bias control circuit 22A is configured to vary the threshold values (A, B, and C) of the bias voltages of the peak amplifier 16, 17*a*, and 17*b* based on the radio frequency signal RF2 (or the radio frequency input signal RFin) and the signal S1 indicating the drive level of the carrier amplifiers 13*a* and 13*b*.

Therefore, since the peak bias control circuit 22A according to the present modification example detects the radio frequency signal RF2 (or the radio frequency input signal RFin), even when a time is required to detect the drive level of the carrier amplifiers 12, 13*a*, and 13*b*, the peak amplifiers 16, 17*a*, and 17*b* can be activated by supplying the predetermined bias voltage from the bias circuits 18, 19*a*, and 19*b* without saturating the carrier amplifiers 12, 13*a*, and 13*b*. As a result, in the radio frequency module 1A including the Doherty amplifier circuit, it is possible to suppress the deterioration in the quality of the radio frequency output signal.

6 Implementation Example of Radio Frequency Module 1A According to Modification Example 1

Next, an implementation example of the radio frequency module 1A configured as described above will be described with reference to FIG. 6.

Figure 6:
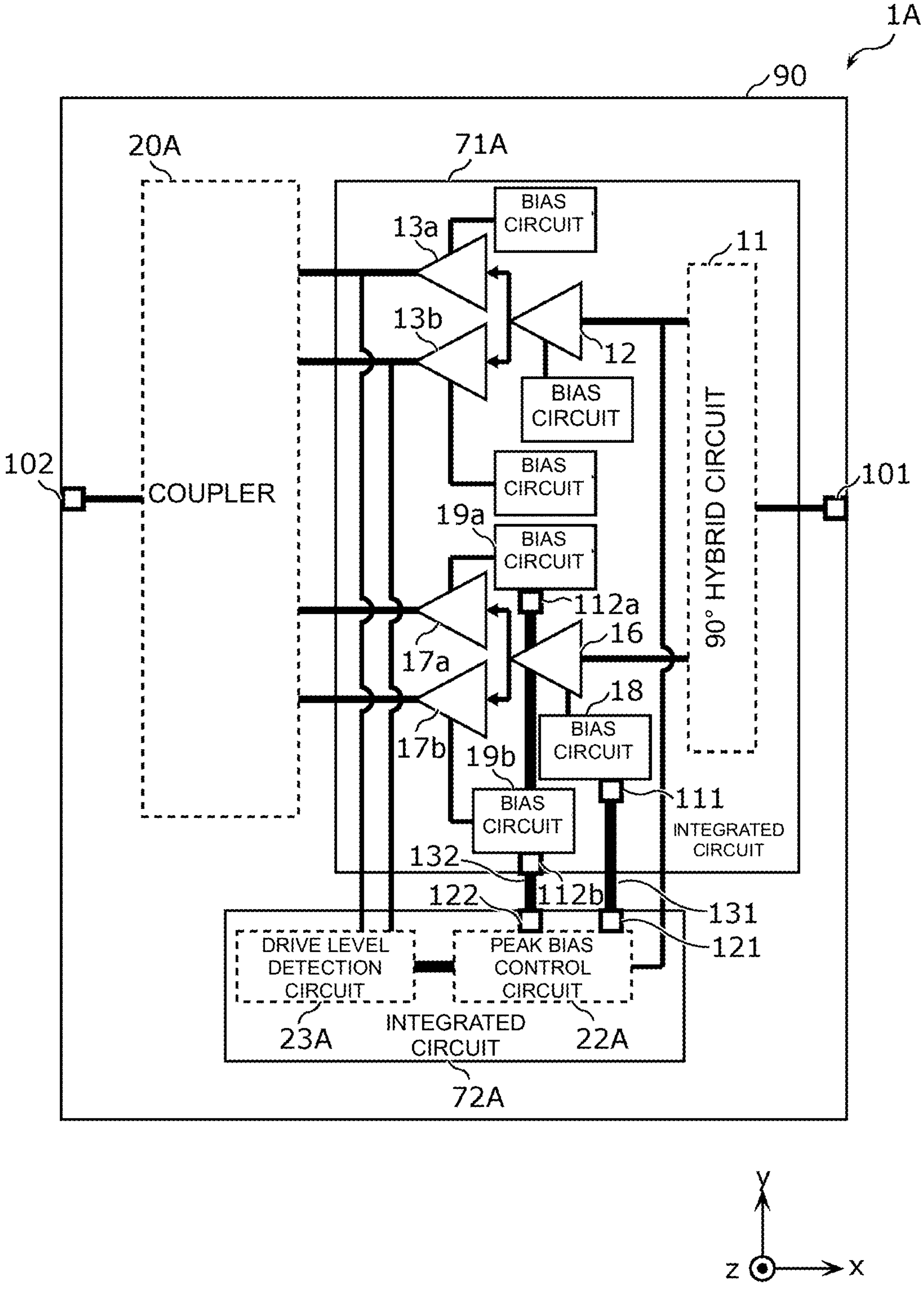
FIG. 6 is a plan view of the radio frequency module according to Modification Example 1 of the exemplary embodiment.

FIG. 6 is a plan view of the radio frequency module 1A according to Modification Example 1 of the exemplary embodiment. FIG. 6 is a view showing the main surface of the module substrate 90 as viewed from the z-axis positive side.

In FIG. 6, a part of wirings for connecting a plurality of circuit components disposed on the module substrate 90 is not shown. In FIG. 6, a resin member that covers the plurality of circuit components and a shield electrode layer that covers a surface of the resin member are not shown. The resin member and the shield electrode layer need not be provided.

As shown in FIG. 6, the radio frequency module 1A includes the module substrate 90, integrated circuits 71A and 72A, the coupler 20A, the radio frequency input terminal 101, and the radio frequency output terminal 102.

The module substrate 90 has a first main surface and a second main surface facing each other. A ground electrode layer or the like is formed in the module substrate 90 and on the main surface. In addition, in FIG. 6, the module substrate 90 has a rectangular shape in a plan view, but the shape of the module substrate 90 is not limited thereto.

The integrated circuit 71A is an example of a first integrated circuit, and includes the carrier amplifiers 12, 13*a*, and 13*b*, the peak amplifiers 16, 17*a*, and 17*b*, the bias circuits 14, 15*a*, 15*b*, 18, 19*a*, and 19*b*, and the 90° hybrid circuit 11. The integrated circuit 71A need not include the bias circuits 14, 15*a*, 15*b*, 18, 19*a*, and 19*b*, and the 90° hybrid circuit 11.

The integrated circuit 72A is an example of a second integrated circuit and includes a control circuit. In addition, in the present implementation example, the control circuit includes the peak bias control circuit 22A and the drive level detection circuit 23A.

In FIG. 6, each of the integrated circuits 71A and 72A has a rectangular shape in a plan view of the module substrate 90, but the shapes of the integrated circuits 71A and 72A are not limited thereto.

The integrated circuit 71A is formed of, for example, at least one of GaAs, SiGe, and GaN. The integrated circuit 71A is configured using Si or CMOS, and may be specifically manufactured through an SOI process.

The integrated circuit 72A is configured using, for example, Si or CMOS, and may be specifically manufactured through an SOI process. The integrated circuit 72A may be formed of the same material as the integrated circuit 71A. The constituent materials of the integrated circuits 71A and 72A are not limited to the above example.

Here, as shown in FIG. 6, the integrated circuit 72A is disposed adjacent to the integrated circuit 71A on the peak amplifier 16, 17*a*, and 17*b* side out of the carrier amplifiers 12, 13*a*, and 13*b*, and the peak amplifiers 16, 17*a*, and 17*b*.

Stated another way, the integrated circuit 72A is disposed adjacent to the integrated circuit 71A on the main surface of the module substrate 90, and is disposed closer to the peak amplifiers 16, 17*a*, and 17*b* than the carrier amplifiers 12, 13*a*, and 13*b* in a plan view of the module substrate 90.

With the above-described configuration, since the peak amplifiers 16, 17*a*, and 17*b* and the peak bias control circuit 22A can be disposed in close proximity to each other, the wirings 131 and 132 that connect the peak amplifier 16 (bias circuit 18 thereof), the peak amplifier 17*a* (bias circuit 19*a* thereof), the peak amplifier 17*b* (bias circuit 19*b* thereof) to the peak bias control circuit 22A can be shortened, and the parasitic capacitance of the wirings 131 and 132 can be reduced. Accordingly, since it is possible to suppress the deterioration in the control signal S2 flowing through the wirings 131 and 132, it is possible to control the threshold values of the bias voltages supplied to the peak amplifiers 16, 17*a*, and 17*b* with high accuracy, and it is possible to suppress the deterioration in the quality of the radio frequency signal output from the radio frequency module 1A.

The integrated circuit 71A includes the terminals 111, 112*a*, and 112*b* exposed on an outer surface of the integrated circuit 71A. The terminal 111 is an example of a first external connection terminal, and is connected to the bias circuit 18 of the peak amplifier 16 and a terminal 121. The terminal 112*a* is an example of a first external connection terminal, and is connected to the bias circuit 19*a* of the peak amplifier 17*a* and the terminal 122. The terminal 112*b* is an example of a first external connection terminal, and is connected to the bias circuit 19*b* of the peak amplifier 17*b* and the terminal 122. In the present exemplary embodiment, the terminals 111, 112*a*, and 112*b* are disposed on a rear surface of the integrated circuit 71A facing the main surface of the module substrate 90.

The integrated circuit 72A includes the terminals 121 and 122 exposed on an outer surface of the integrated circuit 72A. The terminal 121 is an example of a second external connection terminal, and is connected to the peak bias control circuit 22A and the terminal 111. The terminal 122 is an example of a second external connection terminal, and is connected to the peak bias control circuit 22A, and the terminals 112*a* and 112*b*. In the present exemplary embodiment, the terminals 121 and 122 are disposed on a rear surface of the integrated circuit 72A facing the main surface of the module substrate 90.

Each of the integrated circuits 71A and 72A has a rectangular shape in a plan view of the module substrate 90, and in a plan view of the module substrate 90, a virtual straight line connecting the terminal 111 and the terminal 121 and a virtual straight line connecting the terminals 112*a* and 112*b*, and the terminal 122 are perpendicular to outer edges of the integrated circuits 71A and 72A, which face each other in closest proximity to each other.

Therefore, it is possible to minimize the distance between the terminal 111 and the terminal 121, and the distance between the terminals 112*a* and 112*b*, and the terminal 122.

Further, as shown in FIG. 6, the wiring 131 (first wiring) that connects the terminal 111 and the terminal 121, and the wiring 132 (first wiring) that connects the terminals 112*a* and 112*b*, and the terminal 122 are each formed in a linear shape on the module substrate 90.

Therefore, it is possible to minimize each of the wirings 131 and 132, and it is possible to suppress the deterioration in the control signal S2 flowing through the wirings 131 and 132.

As shown in FIG. 6, the drive level detection circuit 23A and the peak bias control circuit 22A are disposed adjacent to each other in the integrated circuit 72A.

Therefore, since a wiring that connects the drive level detection circuit 23A and the peak bias control circuit 22A can be shortened, the signal S1 can be transmitted at a high speed and with a low loss.

7 Implementation Example of Radio Frequency Module 1B According to Modification Example 2

Figure 7:
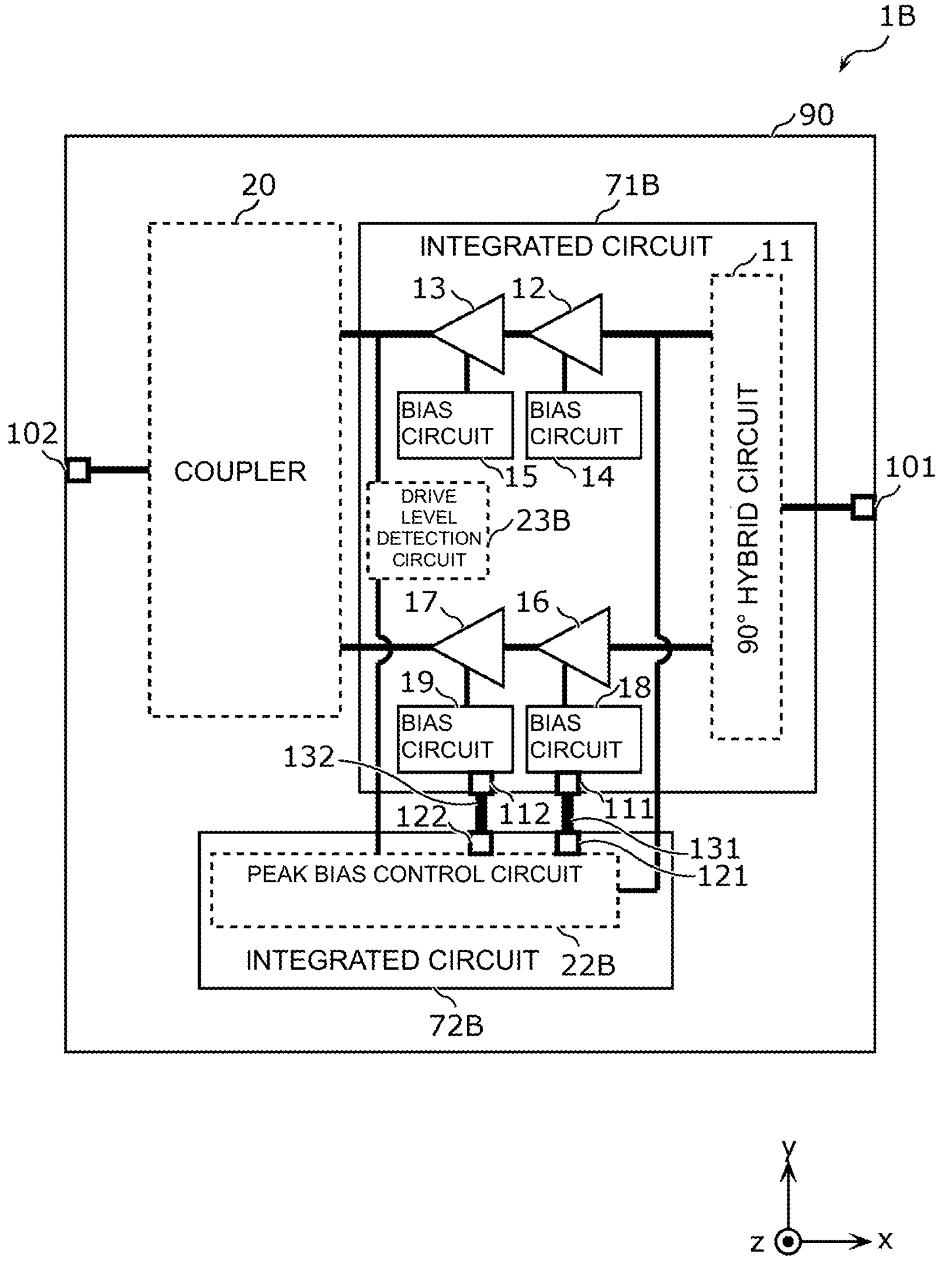
FIG. 7 is a plan view of a radio frequency module according to Modification Example 2 of the exemplary embodiment.

FIG. 7 is a plan view of a radio frequency module 1B according to Modification Example 2 of the exemplary embodiment. FIG. 7 is a view showing the main surface of the module substrate 90 as viewed from the z-axis positive side.

The radio frequency module 1B according to the present modification example has the same circuit configuration as the circuit configuration of the radio frequency module 1 according to the exemplary embodiment, and only the implementation configuration is different. As shown in FIG. 7, the radio frequency module 1B includes the module substrate 90, integrated circuits 71B and 72B, the coupler 20, the radio frequency input terminal 101, and the radio frequency output terminal 102. The radio frequency module 1B according to the present modification example is different from the radio frequency module 1 according to the exemplary embodiment in that the drive level detection circuit 23B is included in the integrated circuit 71B. Hereinafter, the radio frequency module 1B according to the present modification example will be described, and the same configuration as the configuration of the radio frequency module 1 according to the exemplary embodiment will not be described, and a different configuration will be mainly described.

The integrated circuit 71B is an example of a first integrated circuit, and includes the carrier amplifiers 12 and 13, the peak amplifiers 16 and 17, the drive level detection circuit 23B, the bias circuits 14, 15, 18, and 19, and the 90° hybrid circuit 11. The integrated circuit 71B need not include the bias circuits 14, 15, 18, and 19, and the 90° hybrid circuit 11.

The integrated circuit 72B is an example of a second integrated circuit and includes a control circuit. In addition, in the present implementation example, the control circuit includes the peak bias control circuit 22B.

Here, as shown in FIG. 7, the integrated circuit 72B is disposed adjacent to the integrated circuit 71B on the peak amplifier 16 and 17 side out of the carrier amplifiers 12 and 13, and the peak amplifiers 16 and 17.

Stated another way, the integrated circuit 72B is disposed adjacent to the integrated circuit 71B on the main surface of the module substrate 90, and is disposed closer to the peak amplifiers 16 and 17 than the carrier amplifiers 12 and 13 in a plan view of the module substrate 90.

With the above-described configuration, since the peak amplifiers 16 and 17 and the peak bias control circuit 22B can be disposed in close proximity to each other, the wirings 131 and 132 that connect the peak amplifier 16 (bias circuit 18 thereof) and the peak amplifier 17 (bias circuit 19 thereof) to the peak bias control circuit 22B can be shortened, and the parasitic capacitance of the wirings 131 and 132 can be reduced. Accordingly, since it is possible to suppress the deterioration in the control signal S2 flowing through the wirings 131 and 132, it is possible to control the threshold values of the bias voltages supplied to the peak amplifiers 16 and 17 with high accuracy, and it is possible to suppress the deterioration in the quality of the radio frequency signal output from the radio frequency module 1B.

The integrated circuit 72B includes the terminals 121 and 122 exposed on an outer surface of the integrated circuit 72B. The terminal 121 is connected to the peak bias control circuit 22B, and the bias circuit 18 of the peak amplifier 16. The terminal 122 is connected to the peak bias control circuit 22B, and the bias circuit 19 of the peak amplifier 17. In the present modification example, the terminals 121 and 122 are disposed on a rear surface of the integrated circuit 72B facing the main surface of the module substrate 90.

Here, the drive level detection circuit 23B is disposed between the carrier amplifiers 12 and 13 and the integrated circuit 72B in a plan view of the module substrate 90.

Therefore, a wiring that connects the carrier amplifiers 12 and 13 and the drive level detection circuit 23B can be shortened, and the parasitic capacitance on the input side of the carrier amplifiers 12 and 13 can be reduced. In addition, since a wiring that connects the drive level detection circuit 23B and the peak bias control circuit 22B can be shortened, the signal S1 can be transmitted at a high speed and with a low loss.

8 Circuit Configuration of Radio Frequency Module 1C According to Modification Example 3

Figure 8:
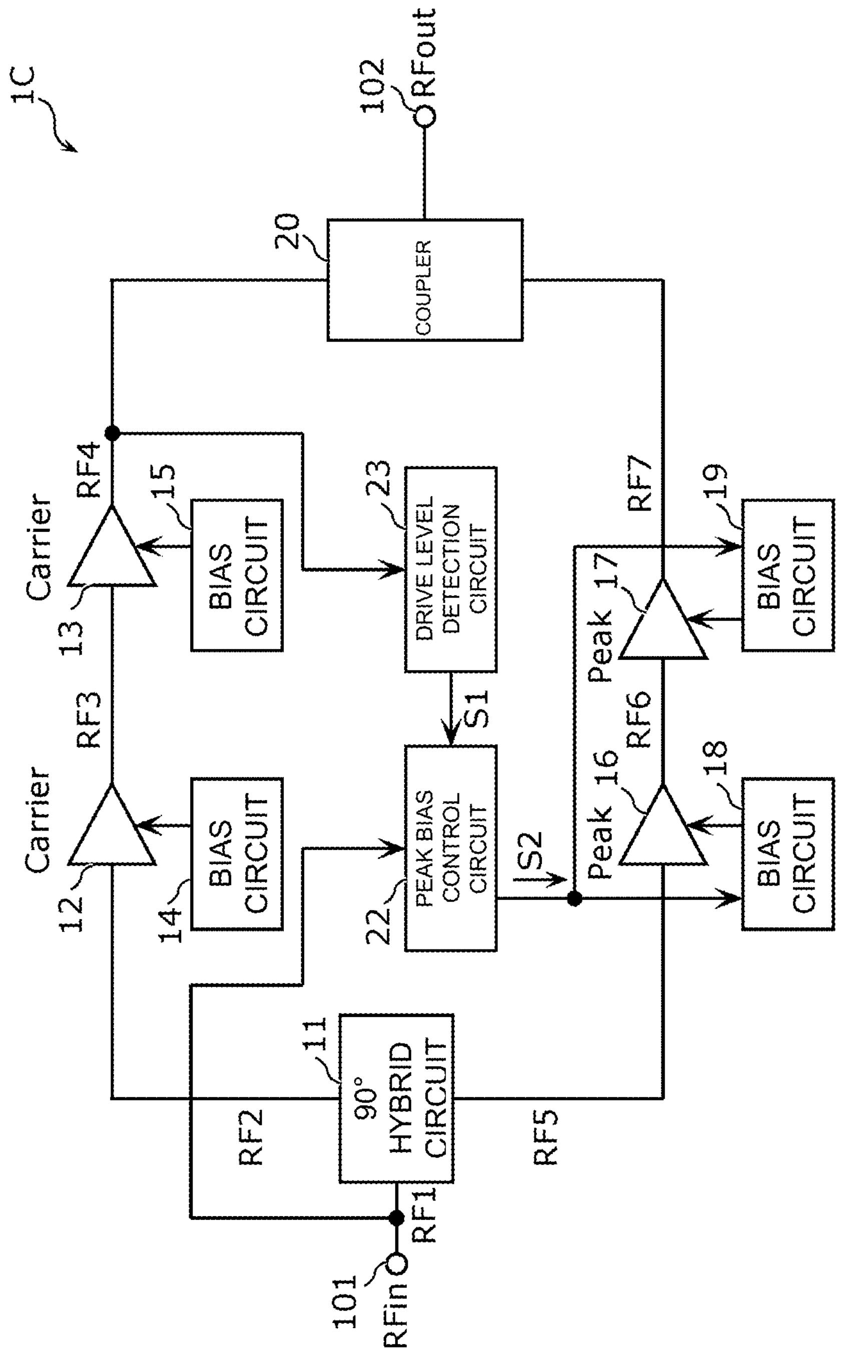
FIG. 8 is a circuit configuration diagram of a radio frequency module according to Modification Example 3 of the exemplary embodiment.

FIG. 8 is a circuit configuration diagram of a radio frequency module 1C according to Modification Example 3 of the exemplary embodiment. The radio frequency module 1C according to the present modification example includes the carrier amplifiers 12 and 13, the peak amplifiers 16 and 17, the 90° hybrid circuit 11, the coupler 20, the peak bias control circuit 22, the drive level detection circuit 23, the bias circuits 14, 15, 18, and 19, the radio frequency input terminal 101, and the radio frequency output terminal 102. With the above-described configuration, the radio frequency module 1C constitutes a Doherty amplifier circuit. The radio frequency module 1C according to the present modification example is different from the radio frequency module 1 according to the exemplary embodiment only in that the radio frequency input signal RFin is input to the peak bias control circuit 22 instead of the radio frequency signal RF2. Hereinafter, the radio frequency module 1C according to the present modification example will be described, and the same configuration as the configuration of the radio frequency module 1 according to the exemplary embodiment will not be described, and a different configuration will be mainly described.

The peak bias control circuit 22 is included in the control circuit, is connected to the input end of the 90° hybrid circuit 11 and the drive level detection circuit 23, and is configured to output the control signal S2 for varying threshold values of the bias voltages of the peak amplifiers 16 and 17 to the bias circuits 18 and 19, based on the radio frequency input signal RFin input to the 90° hybrid circuit 11 and the signal S1 indicating the drive level of the carrier amplifier 13.

9 Implementation Example of Radio Frequency Module 1C According to Modification Example 3

Figure 9:
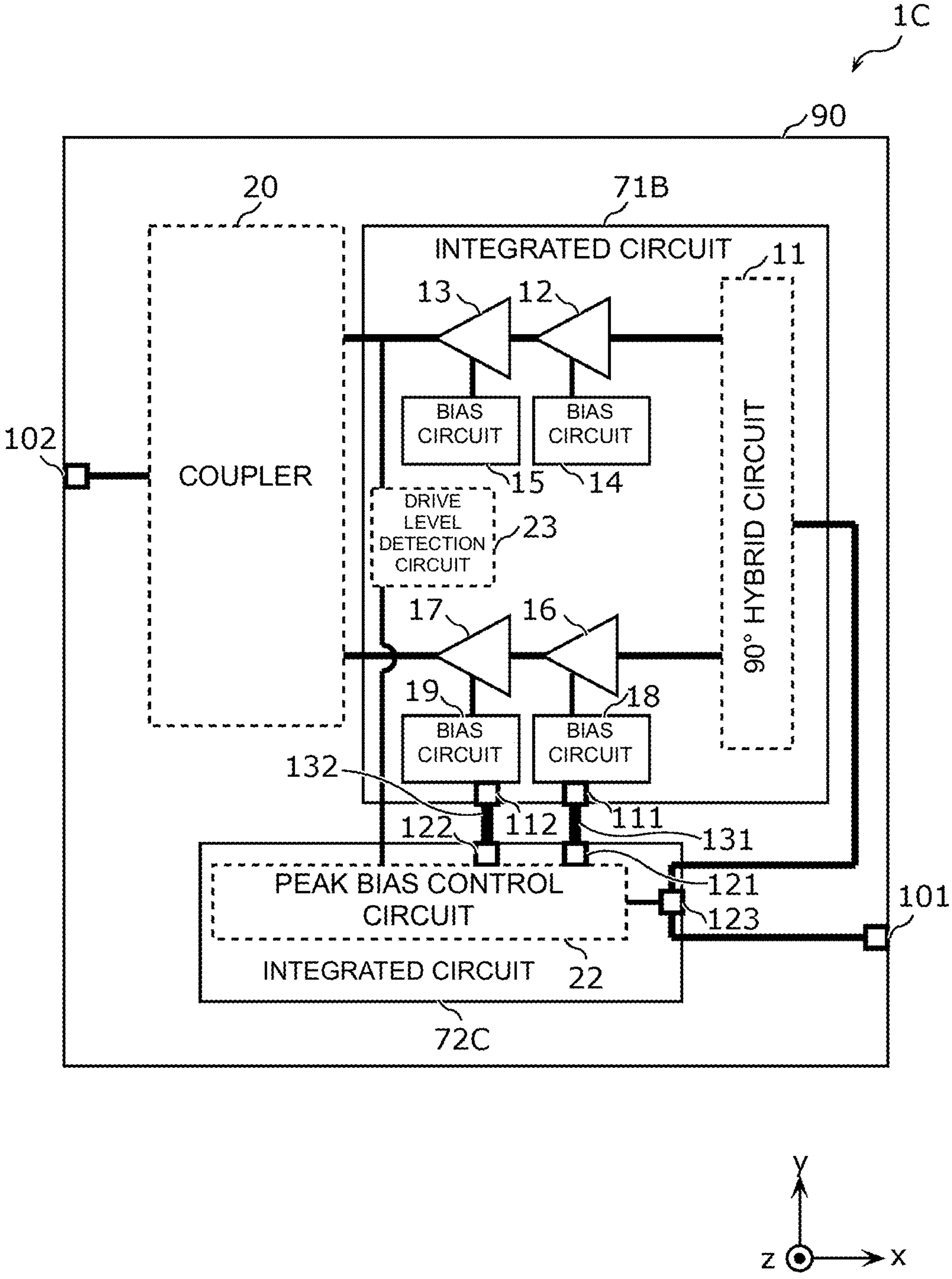
FIG. 9 is a plan view of the radio frequency module according to Modification Example 3 of the exemplary embodiment.

FIG. 9 is a plan view of a radio frequency module 1C according to Modification Example 3 of the exemplary embodiment. FIG. 9 is a view showing the main surface of the module substrate 90 when viewed from the z-axis positive side.

As shown in FIG. 9, the radio frequency module 1C includes the module substrate 90, integrated circuits 71B and 72C, the coupler 20, the radio frequency input terminal 101, and the radio frequency output terminal 102. The radio frequency module 1C according to the present modification example is different from the radio frequency module 1B according to Modification Example 2 in a wiring layout from the radio frequency input terminal 101 to the 90° hybrid circuit 11. Hereinafter, the radio frequency module 1C according to the present modification example will be described, and the same configuration as the configuration of the radio frequency module 1B according to Modification Example 2 will not be described, and a different configuration will be mainly described.

The integrated circuit 71B is an example of a first integrated circuit, and includes the carrier amplifiers 12 and 13, the peak amplifiers 16 and 17, the drive level detection circuit 23, the bias circuits 14, 15, 18, and 19, and the 90° hybrid circuit 11. The integrated circuit 71B need not include the bias circuits 14, 15, 18, and 19, and the 90° hybrid circuit 11.

The integrated circuit 72C is an example of a second integrated circuit and includes a control circuit. In addition, in the present implementation example, the control circuit includes the peak bias control circuit 22.

Here, as shown in FIG. 9, the integrated circuit 72C is disposed adjacent to the integrated circuit 71B on the peak amplifier 16 and 17 side out of the carrier amplifiers 12 and 13, and the peak amplifiers 16 and 17.

Stated another way, the integrated circuit 72C is disposed adjacent to the integrated circuit 71B on the main surface of the module substrate 90, and is disposed closer to the peak amplifiers 16 and 17 than the carrier amplifiers 12 and 13 in a plan view of the module substrate 90.

With the above-described configuration, since the peak amplifiers 16 and 17 and the peak bias control circuit 22 can be disposed in close proximity to each other, the wirings 131 and 132 that connect the peak amplifier 16 (bias circuit 18 thereof) and the peak amplifier 17 (bias circuit 19 thereof) to the peak bias control circuit 22 can be shortened, and the parasitic capacitance of the wirings 131 and 132 can be reduced. Accordingly, since it is possible to suppress the deterioration in the control signal S2 flowing through the wirings 131 and 132, it is possible to control the threshold values of the bias voltages supplied to the peak amplifiers 16 and 17 with high accuracy, and it is possible to suppress the deterioration in the quality of the radio frequency signal output from the radio frequency module 1C.

The integrated circuit 72C includes the terminals 121, 122, and 123 exposed on an outer surface of the integrated circuit 72C. The terminal 121 is connected to the peak bias control circuit 22, and the bias circuit 18 of the peak amplifier 16. The terminal 122 is connected to the peak bias control circuit 22, and the bias circuit 19 of the peak amplifier 17. The terminal 123 is an example of a third external connection terminal, and is connected to the input ends of the peak bias control circuit 22, the radio frequency input terminal 101, and the 90° hybrid circuit 11. In the present modification example, the terminals 121, 122, and 123 are disposed on a rear surface of the integrated circuit 72C facing the main surface of the module substrate 90.

With the above-described configuration, the radio frequency input signal RFin input to the radio frequency module 1C is input to the 90° hybrid circuit 11 through the terminal 123.

Therefore, a main signal wiring that connects the radio frequency input terminal 101 and the 90° hybrid circuit 11 and a wiring that connects the peak bias control circuit 22 can be shortened, and thus the parasitic capacitance of the wiring and the main signal wiring can be reduced. Therefore, it is possible to suppress the deterioration in the quality of the radio frequency signal input to the radio frequency module 1C and the radio frequency signal output from the radio frequency module 1C.

10 Implementation Example of Radio Frequency Module 1D According to Modification Example 4

Figure 10:
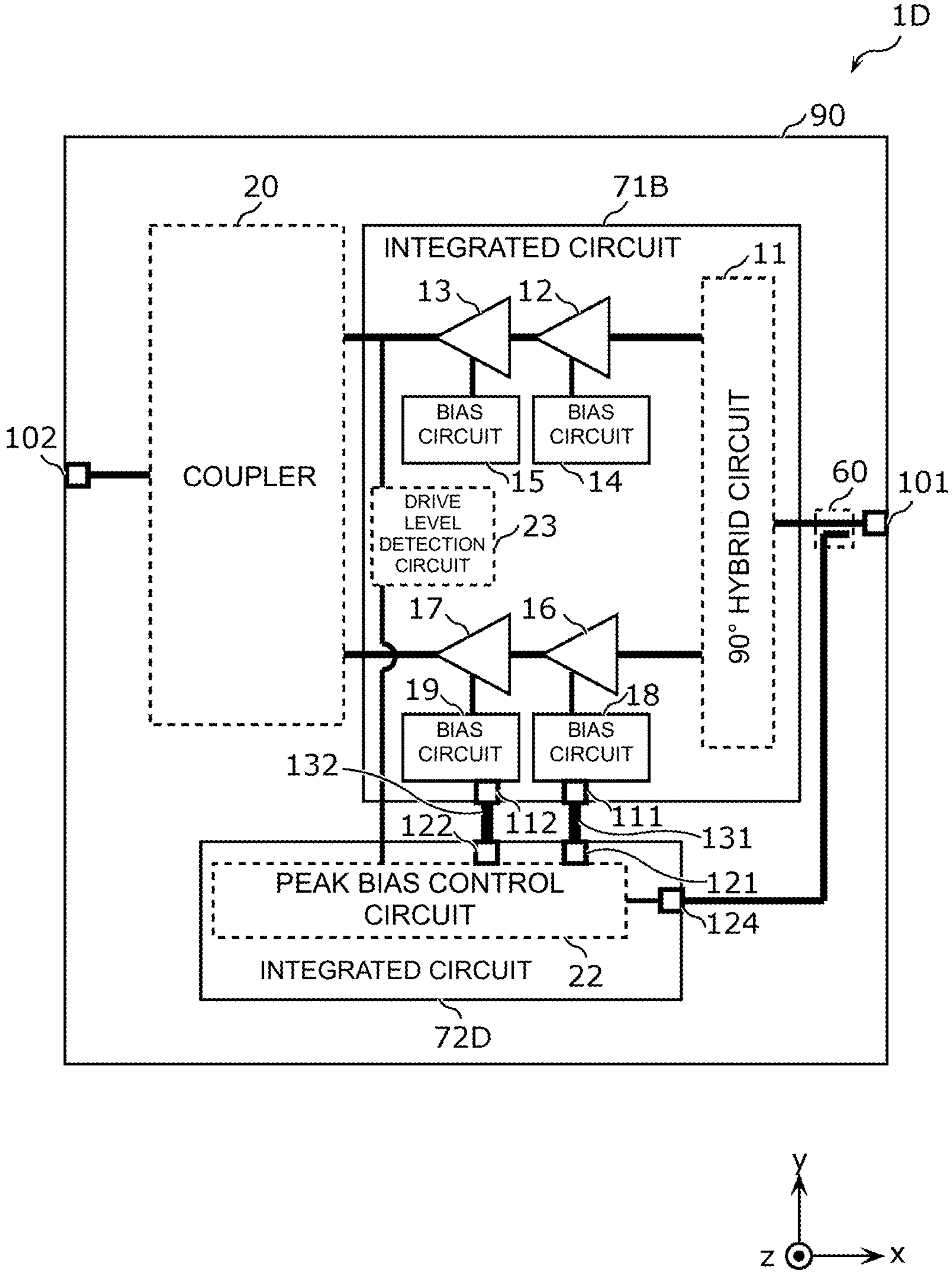
FIG. 10 is a plan view of a radio frequency module according to Modification Example 4 of the exemplary embodiment.

FIG. 10 is a plan view of a radio frequency module 1D according to Modification Example 4 of the exemplary embodiment. FIG. 10 is a view showing the main surface of the module substrate 90 as viewed from the z-axis positive side.

As shown in FIG. 10, the radio frequency module 1D includes the module substrate 90, integrated circuits 71B and 72D, the coupler 20, a directional coupler 60, the radio frequency input terminal 101, and the radio frequency output terminal 102. The radio frequency module 1D according to the present modification example is different from the radio frequency module 1C according to Modification Example 3 in a wiring layout from the radio frequency input terminal 101 to the 90° hybrid circuit 11. Hereinafter, the radio frequency module 1D according to the present modification example will be described, and the same configuration as the configuration of the radio frequency module 1C according to Modification Example 3 will not be described, and a different configuration will be mainly described.

The integrated circuit 72D is an example of a second integrated circuit and includes a control circuit. In addition, in the present implementation example, the control circuit includes the peak bias control circuit 22.

Here, as shown in FIG. 10, the integrated circuit 72D is disposed adjacent to the integrated circuit 71B on the peak amplifier 16 and 17 side out of the carrier amplifiers 12 and 13, and the peak amplifiers 16 and 17.

Stated another way, the integrated circuit 72D is disposed adjacent to the integrated circuit 71B on the main surface of the module substrate 90, and is disposed closer to the peak amplifiers 16 and 17 than the carrier amplifiers 12 and 13 in a plan view of the module substrate 90.

With the above-described configuration, since the peak amplifiers 16 and 17 and the peak bias control circuit 22 can be disposed in close proximity to each other, the wirings 131 and 132 that connect the peak amplifier 16 (bias circuit 18 thereof) and the peak amplifier 17 (bias circuit 19 thereof) to the peak bias control circuit 22 can be shortened, and the parasitic capacitance of the wirings 131 and 132 can be reduced. Accordingly, since it is possible to suppress the deterioration in the control signal S2 flowing through the wirings 131 and 132, it is possible to control the threshold values of the bias voltages supplied to the peak amplifiers 16 and 17 with high accuracy, and it is possible to suppress the deterioration in the quality of the radio frequency signal output from the radio frequency module 1D.

The directional coupler 60 is an example of a coupler, is connected to a main signal wiring that connects the radio frequency input terminal 101 and the 90° hybrid circuit 11, and detects power information of the radio frequency signal that transmits through the main signal wiring. The directional coupler 60 has, for example, a main line and a sub line coupled to each other with an electromagnetic field, and the main line is configured as a part of a main signal wiring.

The integrated circuit 72D includes the terminals 121, 122, and 124 exposed on an outer surface of the integrated circuit 72D. The terminal 121 is connected to the peak bias control circuit 22, and the bias circuit 18 of the peak amplifier 16. The terminal 122 is connected to the peak bias control circuit 22, and the bias circuit 19 of the peak amplifier 17. The terminal 124 is an example of a third external connection terminal, and is connected to a sub line of the peak bias control circuit 22 and the directional coupler 60. In the present modification example, the terminals 121, 122, and 124 are disposed on a rear surface of the integrated circuit 72D facing the main surface of the module substrate 90.

With the above-described configuration, the radio frequency input signal RFin input to the radio frequency module 1D is input to the 90° hybrid circuit 11 through the terminal 124.

Therefore, since the main signal wiring that connects the radio frequency input terminal 101 and the 90° hybrid circuit 11, and the peak bias control circuit 22 are connected through the directional coupler 60, the main signal wiring can be shortened. Therefore, the parasitic capacitance of the main signal wiring can be reduced, and thus it is possible to suppress the deterioration in the quality of the radio frequency signal input to the radio frequency module 1D and the radio frequency signal output from the radio frequency module 1D.

11 Circuit Configuration and Implementation Configuration of Radio Frequency Module 1E According to Modification Example 5

Figure 11:
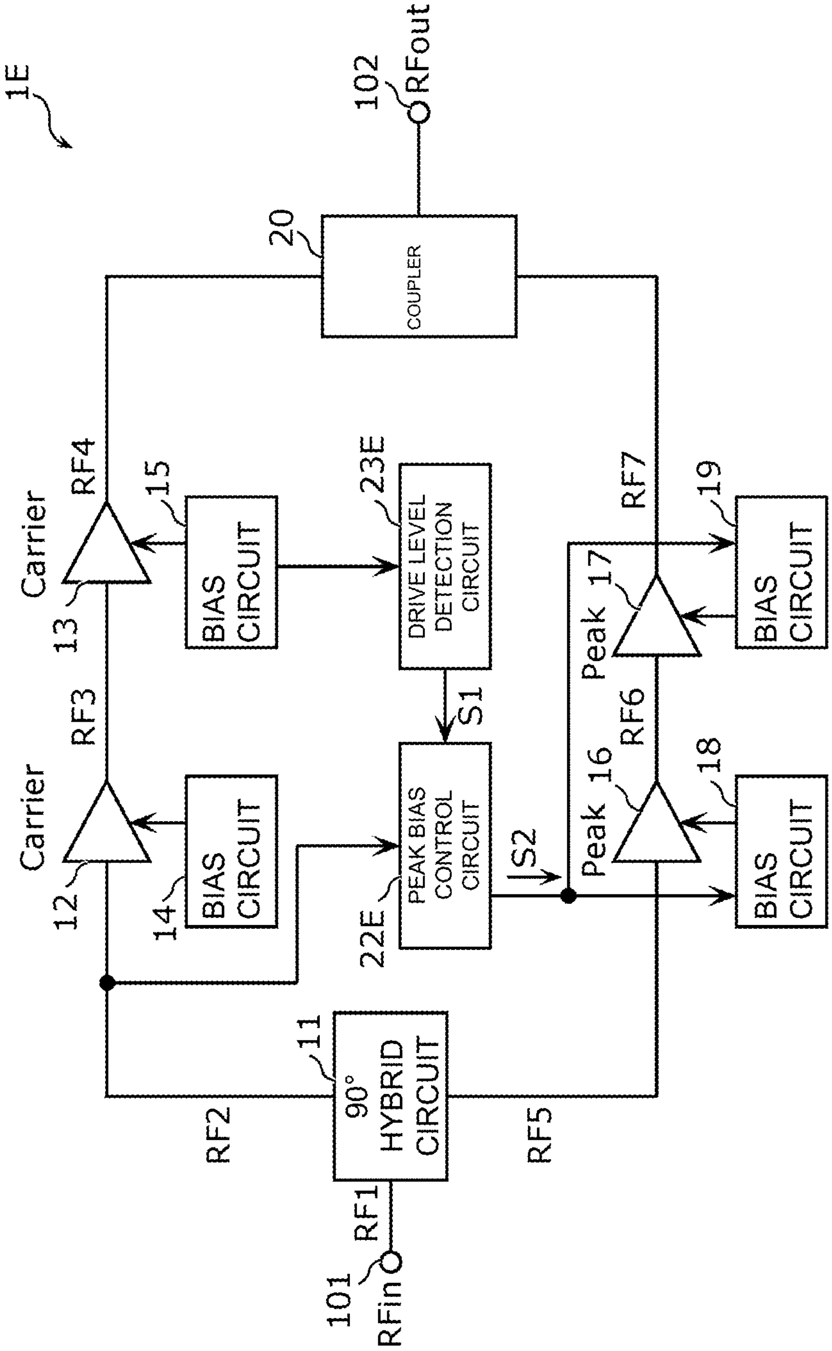
FIG. 11 is a circuit configuration diagram of a radio frequency module according to Modification Example 5 of the exemplary embodiment.

FIG. 11 is a circuit configuration diagram of a radio frequency module 1E according to Modification Example 5 of the exemplary embodiment. The radio frequency module 1E according to the present modification example includes the carrier amplifiers 12 and 13, the peak amplifiers 16 and 17, the 90° hybrid circuit 11, the coupler 20, a peak bias control circuit 22E, a drive level detection circuit 23E, the bias circuits 14, 15, 18, and 19, the radio frequency input terminal 101, and the radio frequency output terminal 102. With the above-described configuration, the radio frequency module 1E constitutes the Doherty amplifier circuit. The radio frequency module 1E according to the present modification example is different from the radio frequency module 1 according to the exemplary embodiment only in that the signal of the bias circuit 15 is input to the drive level detection circuit 23E instead of the radio frequency signal RF4. Hereinafter, the radio frequency module 1E according to the present modification example will be described, and the same configuration as the configuration of the radio frequency module 1 according to the exemplary embodiment will not be described, and a different configuration will be mainly described.

The bias circuit 18 supplies the bias voltage (and the bias current) to the peak amplifier 16 based on the control signal S2 output from the peak bias control circuit 22E. The bias circuit 19 supplies the bias voltage (and the bias current) to the peak amplifier 17 based on the control signal S2 output from the peak bias control circuit 22E.

The drive level detection circuit 23E is connected to the bias circuit 15 and configured to output the signal S1 indicating the drive level of the carrier amplifier 13 to the peak bias control circuit 22E.

The peak bias control circuit 22E is included in the control circuit, a first input end of the peak bias control circuit 22E is connected to the input end of the carrier amplifier 12, a second input end of the peak bias control circuit 22E is connected to the bias circuit 15 through the drive level detection circuit 23E, and an output end of the peak bias control circuit 22E is connected to the bias circuits 18 and 19. That is, the peak bias control circuit 22E is configured to output the control signal S2 for varying the threshold values of the bias voltages of the peak amplifiers 16 and 17 to the bias circuits 18 and 19, based on the radio frequency signal RF2 input to the carrier amplifier 12 and the signal S1 indicating the drive level of the carrier amplifier 13.

The peak bias control circuit 22E may be connected to the input end of the 90° hybrid circuit 11 instead of the input end of the carrier amplifier 12. In this case, the peak bias control circuit 22E is configured to output the control signal S2 for varying the threshold values of the bias voltages of the peak amplifiers 16 and 17 to the bias circuits 18 and 19, based on the radio frequency signal RF1 and the signal S1.

The control signal S2 may be supplied only to the bias circuit 18 among the bias circuits 18 and 19.

In the radio frequency module 1E according to the present modification example, the carrier amplifiers 12 and 13 and the peak amplifiers 16 and 17 are included in the first integrated circuit. The peak bias control circuit 22E is included in the second integrated circuit. Here, the second integrated circuit is disposed adjacent to the first integrated circuit on the peak amplifier 16 and 17 side out of the carrier amplifiers 12 and 13, and the peak amplifiers 16 and 17.

Stated another way, the second integrated circuit is disposed adjacent to the first integrated circuit, and is disposed closer to the peak amplifiers 16 and 17 than the carrier amplifiers 12 and 13.

With the above-described configuration, since the peak amplifiers 16 and 17 and the peak bias control circuit 22E can be disposed in close proximity to each other, the wiring that connects the peak amplifier 16 (bias circuit 18 thereof) and the peak amplifier 17 (bias circuit 19 thereof) to the peak bias control circuit 22E can be shortened, and the parasitic capacitance of the wiring can be reduced. As a result, since it is possible to suppress the deterioration in the control signal S2 flowing through the above-described wiring, it is possible to control the threshold values of the bias voltages supplied to the peak amplifiers 16 and 17 with high accuracy. Therefore, it is possible to suppress the deterioration in the quality of the radio frequency signal output from the radio frequency module 1E.

12 Circuit Configuration of Radio Frequency Module 1F According to Modification Example 6

Figure 12:
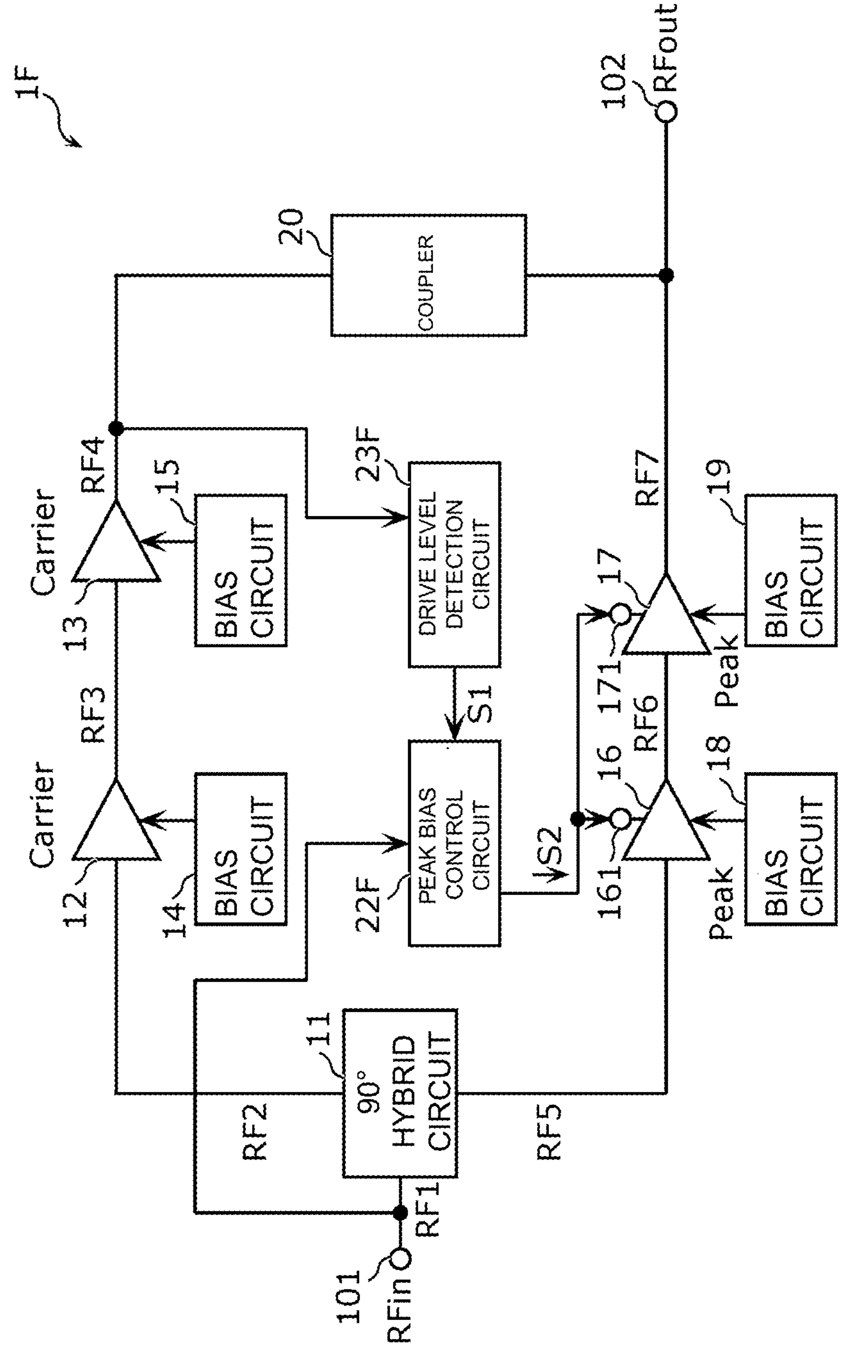
FIG. 12 is a circuit configuration diagram of a radio frequency module according to Modification Example 6 of the exemplary embodiment.

FIG. 12 is a circuit configuration diagram of a radio frequency module 1F according to Modification Example 6 of the exemplary embodiment. The radio frequency module 1F according to the present modification example includes the carrier amplifiers 12 and 13, the peak amplifiers 16 and 17, the 90° hybrid circuit 11, the coupler 20, a peak bias control circuit 22F, a drive level detection circuit 23F, the bias circuits 14, 15, 18, and 19, enable terminals 161 and 171, the radio frequency input terminal 101, and the radio frequency output terminal 102. With the above-described configuration, the radio frequency module 1F constitutes a Doherty amplifier circuit. The radio frequency module 1F according to the present modification example is different from the radio frequency module 1 according to the exemplary embodiment in that the radio frequency input signal RFin is input to the peak bias control circuit 22F instead of the radio frequency signal RF2, and the control signal S2 from the peak bias control circuit 22F is output to the enable terminals 161 and 171 instead of the bias circuits 18 and 19. Hereinafter, the radio frequency module 1F according to the present modification example will be described, and the same configuration as the configuration of the radio frequency module 1 according to the exemplary embodiment will not be described, and a different configuration will be mainly described.

The enable terminal 161 is connected to the peak amplifier 16 and the peak bias control circuit 22F. The enable terminal 171 is connected to the peak amplifier 17 and the peak bias control circuit 22F. That is, the output end of the peak bias control circuit 22F is connected to the peak amplifier 16 through the enable terminal 161, and is connected to the peak amplifier 17 through the enable terminal 171.

The bias circuit 18 supplies the bias voltage (and the bias current) to the peak amplifier 16. The bias circuit 19 supplies the bias voltage (and the bias current) to the peak amplifier 17.

The peak bias control circuit 22F is included in the control circuit, a first input end of the peak bias control circuit 22F is connected to the input end of the 90° hybrid circuit 11, and a second input end of the peak bias control circuit 22F is connected to the output end of the carrier amplifier 13 through the drive level detection circuit 23F. That is, the peak bias control circuit 22F is configured to output the control signal S2 for varying the threshold values of the bias voltages of the peak amplifiers 16 and 17 to the enable terminals 161 and 171, based on the radio frequency input signal RFin input to the 90° hybrid circuit 11 and the signal S1 indicating the drive level of the carrier amplifier 13. With the above-described configuration, for example, the peak bias control circuit 22F controls whether or not to supply the bias voltage to the peak amplifier 16 by outputting the control signal S2 to the enable terminal 161, and controls whether or not to supply the bias voltage to the peak amplifier 17 by outputting the control signal S2 to the enable terminal 171.

The first input end of the peak bias control circuit 22F may be connected to the input end of the carrier amplifier 12.

According to the circuit configuration, since the peak bias control circuit 22F detects the radio frequency input signal RFin (or the radio frequency signal RF2), even when a time is required to detect the drive level of the carrier amplifiers 12 and 13, the peak amplifiers 16 and 17 can be activated by supplying the predetermined bias voltage from the bias circuits 18 and 19 without saturating the carrier amplifiers 12 and 13. As a result, in the radio frequency module 1F including the Doherty amplifier circuit, it is possible to suppress the deterioration in the quality of the radio frequency output signal.

13 Implementation Example of Radio Frequency Module 1F According to Modification Example 6

Figure 13:
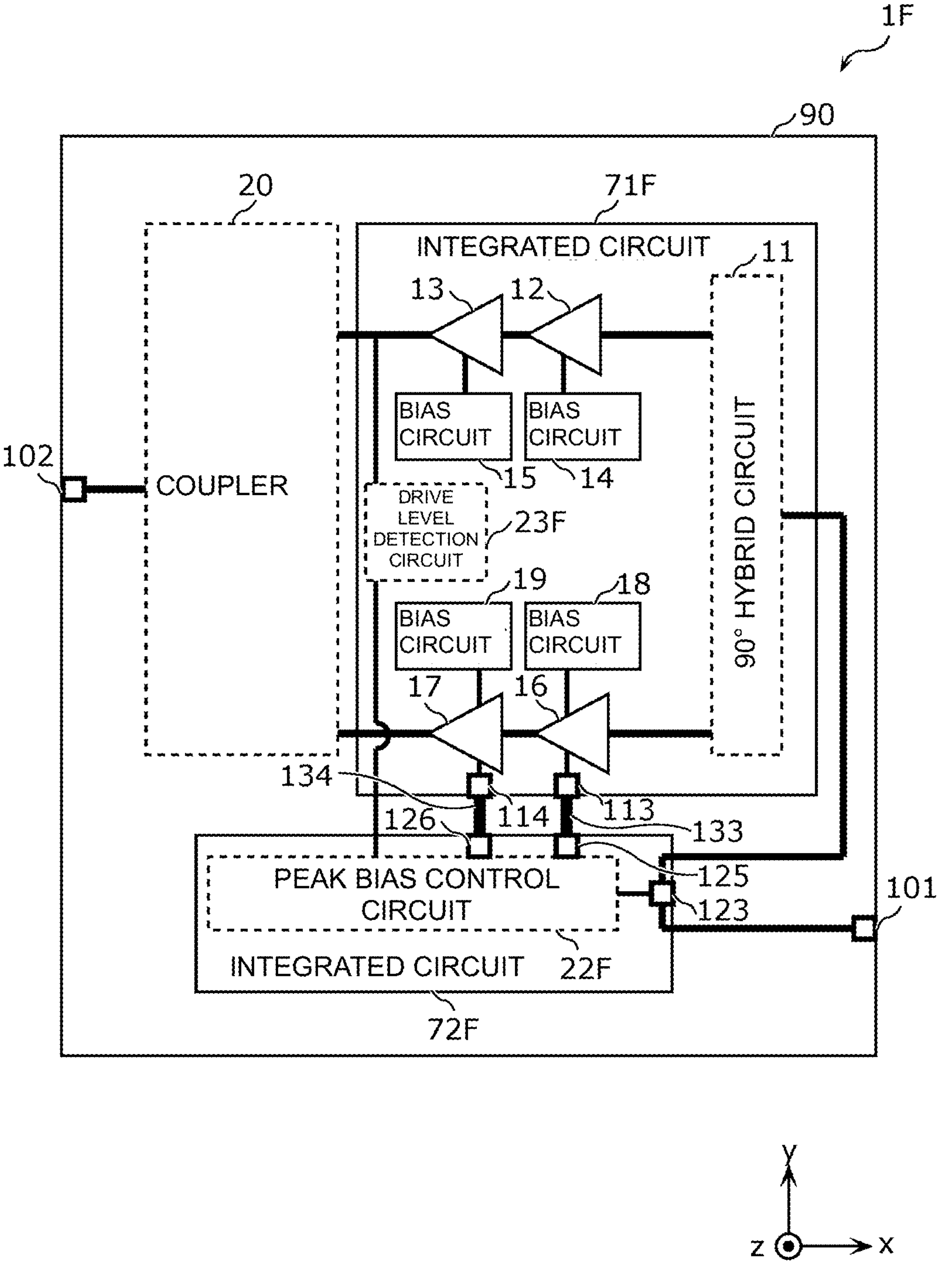
FIG. 13 is a plan view of the radio frequency module according to Modification Example 6 of the exemplary embodiment.

FIG. 13 is a plan view of a radio frequency module 1F according to Modification Example 6 of the exemplary embodiment. FIG. 13 is a view showing the main surface of the module substrate 90 when viewed from the z-axis positive side.

As shown in FIG. 13, the radio frequency module 1F includes the module substrate 90, integrated circuits 71F and 72F, the coupler 20, the radio frequency input terminal 101, and the radio frequency output terminal 102. The radio frequency module 1F according to the present modification example is different from the radio frequency module 1C according to Modification Example 3 in a connection configuration between the integrated circuit 71F and the integrated circuit 72F. Hereinafter, the radio frequency module 1F according to the present modification example will be described, and the same configuration as the configuration of the radio frequency module 1C according to Modification Example 3 will not be described, and a different configuration will be mainly described.

The integrated circuit 71F is an example of a first integrated circuit, and includes the carrier amplifiers 12 and 13, the peak amplifiers 16 and 17, the drive level detection circuit 23F, the bias circuits 14, 15, 18, and 19, and the 90° hybrid circuit 11. The integrated circuit 71F need not include the bias circuits 14, 15, 18, and 19, and the 90° hybrid circuit 11.

The integrated circuit 72F is an example of a second integrated circuit and includes a control circuit. In addition, in the present implementation example, the control circuit includes the peak bias control circuit 22F.

Here, as shown in FIG. 13, the integrated circuit 72F is disposed adjacent to the integrated circuit 71F on the peak amplifier 16 and 17 side out of the carrier amplifiers 12 and 13, and the peak amplifiers 16 and 17.

Stated another way, the integrated circuit 72F is disposed adjacent to the integrated circuit 71F on the main surface of the module substrate 90, and is disposed closer to the peak amplifiers 16 and 17 than the carrier amplifiers 12 and 13 in a plan view of the module substrate 90.

With the above-described configuration, since the peak amplifiers 16 and 17 and the peak bias control circuit 22F can be disposed in close proximity to each other, the wirings 133 and 134 that connect the peak amplifier 16 (bias circuit 18 thereof) and the peak amplifier 17 (bias circuit 19 thereof) to the peak bias control circuit 22F can be shortened, and the parasitic capacitance of the wirings 133 and 134 can be reduced. Accordingly, since it is possible to suppress the deterioration in the control signal S2 flowing through the wirings 133 and 134, it is possible to control the threshold values of the bias voltages supplied to the peak amplifiers 16 and 17 with high accuracy, and it is possible to suppress the deterioration in the quality of the radio frequency signal output from the radio frequency module 1F.

The integrated circuit 71F includes the terminals 113 and 114 exposed on an outer surface of the integrated circuit 71F. The terminal 113 is an example of the enable terminal 161, and is connected to the terminal 125 and the peak amplifier 16. The terminal 114 is an example of the enable terminal 171, and is connected to the terminal 126 and the peak amplifier 17. In the present exemplary embodiment, the terminals 113 and 114 are disposed on a rear surface of the integrated circuit 71F facing the main surface of the module substrate 90.

The integrated circuit 72F includes the terminals 123, 125, and 126 exposed on an outer surface of the integrated circuit 72F. The terminal 125 is connected to the peak bias control circuit 22F and the terminal 113. The terminal 126 is connected to the peak bias control circuit 22F and the terminal 114. The terminal 123 is an example of a third external connection terminal, and is connected to the input ends of the peak bias control circuit 22F, the radio frequency input terminal 101, and the 90° hybrid circuit 11. In the present modification example, the terminals 123, 125, and 126 are disposed on a rear surface of the integrated circuit 72F facing the main surface of the module substrate 90.

With the above-described configuration, since the peak amplifiers 16 and 17, and the peak bias control circuit 22F can be disposed in close proximity to each other, a wiring that connects the peak amplifiers 16 and 17, and the peak bias control circuit 22F can be shortened, and the parasitic capacitance of the wiring can be reduced. As a result, since it is possible to suppress the deterioration in the control signal S2 flowing through the above-described wiring, it is possible to control the threshold values of the bias voltages supplied to the peak amplifiers 16 and 17 with high accuracy. Therefore, it is possible to suppress the deterioration in the quality of the radio frequency signal output from the radio frequency module 1F.

In addition, since the main signal wiring that connects the radio frequency input terminal 101 and the 90° hybrid circuit 11 and a wiring that connects the peak bias control circuit 22F can be shortened, and thus the parasitic capacitance of the wiring and the main signal wiring can be reduced. Therefore, it is possible to suppress the deterioration in the quality of the radio frequency signal input to the radio frequency module 1F.

14 Effects and Like

As described above, the radio frequency module 1 according to the present exemplary embodiment includes the carrier amplifier and the peak amplifier, the 90° hybrid circuit 11 connected to the input end of the carrier amplifier and the input end of the peak amplifier, the coupler 20 connected to the output end of the carrier amplifier and the output end of the peak amplifier, and the control circuit configured to vary the threshold value of the bias voltage of the peak amplifier based on the radio frequency signal input to the 90° hybrid circuit 11 or the carrier amplifier, and the signal S1 indicating the drive level of the carrier amplifier, in which the carrier amplifier and the peak amplifier are included in the integrated circuit 71, the control circuit is included in the integrated circuit 72, and the integrated circuit 72 is disposed adjacent to the integrated circuit 71 on a peak amplifier side out of the carrier amplifier and the peak amplifier.

Therefore, since the peak amplifier and the control circuit can be disposed in close proximity to each other, a wiring that connects the peak amplifier (bias circuit) and the control circuit can be shortened, and the parasitic capacitance of the wiring can be reduced. As a result, since it is possible to suppress the deterioration in the control signal S2 flowing through the above-described wiring, it is possible to control the threshold value of the bias voltage supplied to the peak amplifier with high accuracy. Therefore, it is possible to suppress the deterioration in the quality of the radio frequency signal output from the radio frequency module 1.

In addition, for example, in the radio frequency module 1 (and 1A and 1E), the control circuit includes the drive level detection circuit 23 connected to the output end of the carrier amplifier and configured to output the signal S1 indicating the drive level of the carrier amplifier, and the peak bias control circuit 22 connected to the input end of the 90° hybrid circuit 11 or the input end of the carrier amplifier, and the drive level detection circuit 23, and configured to output the control signal S2 for varying the threshold value of the bias voltage of the peak amplifier to the bias circuits of the peak amplifier.

Therefore, since the peak amplifier and the peak bias control circuit 22 can be disposed in close proximity to each other, a wiring that connects the peak amplifier (bias circuit) and the peak bias control circuit 22 can be shortened, and the parasitic capacitance of the wiring can be reduced. As a result, since it is possible to suppress the deterioration in the control signal S2 flowing through the above-described wiring, it is possible to control the threshold value of the bias voltage supplied to the peak amplifier with high accuracy. Therefore, it is possible to suppress the deterioration in the quality of the radio frequency signal output from the radio frequency module 1.

In addition, for example, the radio frequency module 1 further includes the module substrate 90, in which the integrated circuits 71 and 72 are disposed on the main surface of the module substrate 90, the integrated circuit 71 includes the terminal 111 connected to the bias circuit of the peak amplifier, the integrated circuit 72 includes the terminal 121 connected to the peak bias control circuit 22, each of the integrated circuits 71 and 72 has a rectangular shape in a plan view of the module substrate 90, and in a plan view of the module substrate 90, the virtual straight line connecting the terminal 111 and the terminal 121 is perpendicular to the outer edges of the integrated circuits 71 and 72, which face each other in closest proximity to each other.

Therefore, it is possible to minimize the distance between the terminal 111 and the terminal 121.

In addition, for example, in the radio frequency module 1, the wiring 131 that connects the terminal 111 and the terminal 121 has a linear shape and is formed on the module substrate 90.

Therefore, it is possible to minimize the wiring 131, and it is possible to suppress the deterioration in the control signal S2 flowing through the wiring 131.

In addition, for example, in the radio frequency module 1, the drive level detection circuit 23 and the peak bias control circuit 22 are disposed adjacent to each other in the integrated circuit 72.

Therefore, since a wiring that connects the drive level detection circuit 23 and the peak bias control circuit 22 can be shortened, the signal S1 can be transmitted at a high speed and with a low loss.

In addition, for example, the radio frequency module 1B (and 1C, 1D, and 1F) further includes the drive level detection circuit 23B connected to the output end of the carrier amplifier and configured to output the signal S1 indicating the drive level of the carrier amplifier, in which the control circuit includes the peak bias control circuit 22B connected to the input end of the 90° hybrid circuit 11 or the input end of the carrier amplifier, and the drive level detection circuit 23B, and configured to output the control signal S2 for varying the threshold value of the bias voltage of the peak amplifier to the bias circuit of the peak amplifier.

Therefore, since the peak amplifier and the peak bias control circuit 22B can be disposed in close proximity to each other, a wiring that connects the peak amplifier (bias circuit) and the peak bias control circuit 22B can be shortened, and the parasitic capacitance of the wiring can be reduced. As a result, since it is possible to suppress the deterioration in the control signal S2 flowing through the above-described wiring, it is possible to control the threshold value of the bias voltage supplied to the peak amplifier with high accuracy. Therefore, it is possible to suppress the deterioration in the quality of the radio frequency signal output from the radio frequency module 1B (and 1C, 1D, and 1F).

In addition, for example, in the radio frequency module 1B, the integrated circuit 71B includes the drive level detection circuit 23B, the integrated circuits 71B and 72B are disposed on the main surface of the module substrate 90, and the drive level detection circuit 23B is disposed between the carrier amplifier and the integrated circuit 72B in a plan view of the module substrate 90.

Therefore, a wiring that connects the carrier amplifier and the drive level detection circuit 23B can be shortened, and the parasitic capacitance on the input side of the carrier amplifier can be reduced. In addition, since a wiring that connects the drive level detection circuit 23B and the peak bias control circuit 22B can be shortened, the signal S1 can be transmitted at a high speed and with a low loss.

In addition, for example, in the radio frequency module 1C, the integrated circuit 72C includes a terminal 123 connected to the peak bias control circuit 22, and the radio frequency signal input to the radio frequency module 1C is input to the 90° hybrid circuit 11 through the terminal 123.

Therefore, a main signal wiring that connects the radio frequency input terminal 101 and the 90° hybrid circuit 11 and a wiring that connects the peak bias control circuit 22 can be shortened, and thus the parasitic capacitance of the wiring and the main signal wiring can be reduced. Therefore, it is possible to suppress the deterioration in the quality of the radio frequency signal input to the radio frequency module 1C and the radio frequency signal output from the radio frequency module 1C.

In addition, for example, the radio frequency module 1D further includes the directional coupler 60 connected to the input end of the 90° hybrid circuit 11, in which the integrated circuit 72D includes the terminal 124 connected to the peak bias control circuit 22 and the directional coupler 60.

Therefore, the main signal wiring that connects the radio frequency input terminal 101 and the 90° hybrid circuit 11 can be shortened. Therefore, the parasitic capacitance of the main signal wiring can be reduced, and thus it is possible to suppress the deterioration in the quality of the radio frequency signal input to the radio frequency module 1D and the radio frequency signal output from the radio frequency module 1D.

In addition, for example, in the radio frequency module 1 (and 1A, 1B, 1C, 1D, 1E, and 1F), the integrated circuits 71 and 72 are disposed on the main surface of the module substrate 90, and the integrated circuit 72 is disposed closer to the peak amplifier than the carrier amplifier in a plan view of the module substrate 90.

Therefore, since the peak amplifier and the control circuit can be disposed in close proximity to each other, a wiring that connects the peak amplifier (bias circuit) and the control circuit can be shortened, and the parasitic capacitance of the wiring can be reduced.

The radio frequency module 1E according to Modification Example 5 includes the carrier amplifier and the peak amplifier, the 90° hybrid circuit 11 connected to the input end of the carrier amplifier and the input end of the peak amplifier, the coupler 20 connected to the output end of the carrier amplifier and the output end of the peak amplifier, and the control circuit configured to vary the threshold value of the bias voltage of the peak amplifier, in which the first input end of the control circuit is connected to the input end of the carrier amplifier, the second input end of the control circuit is connected to the bias circuit of the carrier amplifier, the output end of the control circuit is connected to the bias circuit of the peak amplifier, the carrier amplifier and the peak amplifier are included in the first integrated circuit, the control circuit is included in the second integrated circuit, and the second integrated circuit is disposed adjacent to the first integrated circuit on a peak amplifier side out of the carrier amplifier and the peak amplifier.

Therefore, since the peak amplifier and the control circuit can be disposed in close proximity to each other, a wiring that connects the peak amplifier (bias circuit) and the control circuit can be shortened, and the parasitic capacitance of the wiring can be reduced. As a result, since it is possible to suppress the deterioration in the control signal S2 flowing through the above-described wiring, it is possible to control the threshold value of the bias voltage supplied to the peak amplifier with high accuracy. Therefore, it is possible to suppress the deterioration in the quality of the radio frequency signal output from the radio frequency module 1E.

The radio frequency module 1F according to Modification Example 6 includes the carrier amplifier and the peak amplifier, the 90° hybrid circuit 11 connected to the input end of the carrier amplifier and the input end of the peak amplifier, the coupler 20 connected to the output end of the carrier amplifier and the output end of the peak amplifier, and the control circuit, in which the first input end of the control circuit is connected to the input end of the 90° hybrid circuit 11 or the input end of the carrier amplifier, the second input end of the control circuit is connected to the output end of the carrier amplifier, the output end of the control circuit is connected to the peak amplifier, the carrier amplifier and the peak amplifier are included in the first integrated circuit, the control circuit is included in the second integrated circuit, and the second integrated circuit is disposed adjacent to the first integrated circuit on a peak amplifier side out of the carrier amplifier and the peak amplifier.

Therefore, since the peak amplifier and the control circuit can be disposed in close proximity to each other, a wiring that connects the peak amplifier and the control circuit can be shortened, and the parasitic capacitance of the wiring can be reduced. As a result, since it is possible to suppress the deterioration in the control signal S2 flowing through the above-described wiring, it is possible to control the threshold value of the bias voltage supplied to the peak amplifier with high accuracy. Therefore, it is possible to suppress the deterioration in the quality of the radio frequency signal output from the radio frequency module 1F.

Other Embodiments and Like

Although the radio frequency module according to the exemplary embodiment of the present disclosure has been described with reference to the exemplary embodiment and the modification examples, the radio frequency module according to the exemplary embodiment of the present disclosure is not limited to the exemplary embodiment and the modification examples described above. The present disclosure also includes another exemplary embodiment realized by combining any constituent elements in the exemplary embodiment and the modification examples described above, a modification example obtained by making various modifications that can be conceived of by those skilled in the art with respect to the exemplary embodiment and the modification examples described above within a range that does not deviate from the gist of the present disclosure, or various devices with built-in radio frequency modules.

For example, in the radio frequency module according to the exemplary embodiment and the modification examples described above, another circuit element, another wiring, or the like may be inserted into the path for connecting the circuit elements and the signal paths disclosed in the drawings.

Hereinafter, features of the radio frequency module described based on the above-described exemplary embodiment will be described.

<1>

A radio frequency module including: a carrier amplifier and a peak amplifier; a branching circuit connected to an input end of the carrier amplifier and an input end of the peak amplifier; a synthesis circuit connected to an output end of the carrier amplifier and an output end of the peak amplifier; and a control circuit configured to vary a threshold value of a bias voltage of the peak amplifier based on a radio frequency signal input to the branching circuit or the carrier amplifier, and a signal indicating a drive level of the carrier amplifier, in which the carrier amplifier and the peak amplifier are included in a first integrated circuit, the control circuit is included in a second integrated circuit, and the second integrated circuit is disposed adjacent to the first integrated circuit on a peak amplifier side out of the carrier amplifier and the peak amplifier.

<2>

The radio frequency module according to <1>, in which the control circuit includes a drive level detection circuit connected to the output end of the carrier amplifier and configured to output the signal indicating the drive level of the carrier amplifier, and a peak bias control circuit connected to an input end of the branching circuit or the input end of the carrier amplifier, and the drive level detection circuit, and configured to output a control signal for varying the threshold value of the bias voltage of the peak amplifier to a bias circuit of the peak amplifier.

<3>

The radio frequency module according to <2>, further including: a module substrate, in which the first integrated circuit and the second integrated circuit are disposed on a main surface of the module substrate, the first integrated circuit includes a first external connection terminal connected to the bias circuit of the peak amplifier, the second integrated circuit includes a second external connection terminal connected to the peak bias control circuit, each of the first integrated circuit and the second integrated circuit has a rectangular shape in a plan view of the module substrate, and in the plan view of the module substrate, a virtual straight line connecting the first external connection terminal and the second external connection terminal is perpendicular to outer edges of the first integrated circuit and the second integrated circuit, which face each other in closest proximity to each other.

<4>

The radio frequency module according to <3>, in which a first wiring that connects the first external connection terminal and the second external connection terminal has a linear shape and is formed on the module substrate.

<5>

The radio frequency module according to <3> or <4>, in which the drive level detection circuit and the peak bias control circuit are disposed adjacent to each other in the second integrated circuit.

<6>

The radio frequency module according to <1>, further including: a drive level detection circuit connected to the output end of the carrier amplifier and configured to output the signal indicating the drive level of the carrier amplifier, in which the control circuit includes a peak bias control circuit connected to an input end of the branching circuit or the input end of the carrier amplifier, and the drive level detection circuit, and configured to output a control signal for varying the threshold value of the bias voltage of the peak amplifier to a bias circuit of the peak amplifier.

<7>

The radio frequency module according to <6>, further including: a module substrate, in which the first integrated circuit includes the drive level detection circuit, the first integrated circuit and the second integrated circuit are disposed on a main surface of the module substrate, and in a plan view of the module substrate, the drive level detection circuit is disposed between the carrier amplifier and the second integrated circuit.

<8>

The radio frequency module according to any one of <2> to <7>, in which the second integrated circuit includes a third external connection terminal connected to the peak bias control circuit, and a radio frequency signal input to the radio frequency module is input to the branching circuit through the third external connection terminal.

<9>

The radio frequency module according to any one of <2> to <7>, further including: a directional coupler connected to the input end of the branching circuit, in which the second integrated circuit includes a third external connection terminal connected to the peak bias control circuit and the directional coupler.

<10>

The radio frequency module according to any one of <1> to <9>, further including: a module substrate, in which the first integrated circuit and the second integrated circuit are disposed on a main surface of the module substrate, and in a plan view of the module substrate, the second integrated circuit is disposed closer to the peak amplifier than the carrier amplifier.

<11>

A radio frequency module including: a carrier amplifier and a peak amplifier; a branching circuit connected to an input end of the carrier amplifier and an input end of the peak amplifier; a synthesis circuit connected to an output end of the carrier amplifier and an output end of the peak amplifier; and a control circuit configured to vary a threshold value of a bias voltage of the peak amplifier, in which a first input end of the control circuit is connected to the input end of the carrier amplifier, a second input end of the control circuit is connected to a bias circuit of the carrier amplifier, an output end of the control circuit is connected to a bias circuit of the peak amplifier, the carrier amplifier and the peak amplifier are included in a first integrated circuit, the control circuit is included in a second integrated circuit, and the second integrated circuit is disposed adjacent to the first integrated circuit on a peak amplifier side out of the carrier amplifier and the peak amplifier.

<12>

The radio frequency module according to <11>, further including: a module substrate, in which the first integrated circuit and the second integrated circuit are disposed on a main surface of the module substrate, and in a plan view of the module substrate, the second integrated circuit is disposed closer to the peak amplifier than the carrier amplifier.

<13>

A radio frequency module including: a carrier amplifier and a peak amplifier; a branching circuit connected to an input end of the carrier amplifier and an input end of the peak amplifier; a synthesis circuit connected to an output end of the carrier amplifier and an output end of the peak amplifier; and a control circuit, in which a first input end of the control circuit is connected to an input end of the branching circuit or the input end of the carrier amplifier, a second input end of the control circuit is connected to the output end of the carrier amplifier, an output end of the control circuit is connected to the peak amplifier, the carrier amplifier and the peak amplifier are included in a first integrated circuit, the control circuit is included in a second integrated circuit, and the second integrated circuit is disposed adjacent to the first integrated circuit on a peak amplifier side out of the carrier amplifier and the peak amplifier.

<14>

The radio frequency module according to <13>, further including: a module substrate, in which the first integrated circuit and the second integrated circuit are disposed on a main surface of the module substrate, and in a plan view of the module substrate, the second integrated circuit is disposed closer to the peak amplifier than the carrier amplifier.

<15>

The radio frequency module according to any one of <1> to <10>, wherein the module substrate includes a low-temperature co-fired ceramic (LTCC) substrate.

<16>

The radio frequency module according to any one of <1> to <10>, wherein the module substrate includes a high-temperature co-fired ceramic (HTCC) substrate.

<17>

The radio frequency module according to any one of <1> to <10>, wherein the module substrate has a laminated structure.

<18>

The radio frequency module according to <17>, wherein the module substrate includes a redistribution layer.

<19>

The radio frequency module according to any one of <1> to <10>, wherein the first integrated circuit is formed of at least one of GaAs, SiGe, and GaN.

<20>

The radio frequency module according to claim 1, wherein the second integrated circuit is formed of at least one of silicon or a complementary metal oxide semiconductor (CMOS).

The present disclosure can be widely used in a communication device such as a mobile phone, as a radio frequency module disposed in a multi-band compatible front end portion.

What is claimed is:

1. A radio frequency module comprising:

a carrier amplifier and a peak amplifier;

a branching circuit connected to an input end of the carrier amplifier and an input end of the peak amplifier;

a synthesis circuit connected to an output end of the carrier amplifier and an output end of the peak amplifier; and a control circuit configured to vary a threshold value of a bias voltage of the peak amplifier based on a radio frequency signal input to the branching circuit or the carrier amplifier, and a signal indicating a drive level of the carrier amplifier, wherein the carrier amplifier and the peak amplifier are included in a first integrated circuit, the control circuit is included in a second integrated circuit, and the second integrated circuit is disposed adjacent to the first integrated circuit on a peak amplifier side.

2. The radio frequency module according to claim 1, wherein the control circuit includes a drive level detection circuit connected to the output end of the carrier amplifier and configured to output the signal indicating the drive level of the carrier amplifier, and a peak bias control circuit connected to an input end of the branching circuit or the input end of the carrier amplifier, and the drive level detection circuit, and configured to output a control signal for varying the threshold value of the bias voltage of the peak amplifier to a bias circuit of the peak amplifier.

3. The radio frequency module according to claim 2, further comprising:

a module substrate, wherein the first integrated circuit and the second integrated circuit are disposed on a main surface of the module substrate, the first integrated circuit includes a first external connection terminal connected to the bias circuit of the peak amplifier, the second integrated circuit includes a second external connection terminal connected to the peak bias control circuit, each of the first integrated circuit and the second integrated circuit has a rectangular shape in a plan view of the module substrate, and in the plan view of the module substrate, a virtual straight line connecting the first external connection terminal and the second external connection terminal is perpendicular to outer edges of the first integrated circuit and the second integrated circuit, which face each other in closest proximity to each other.

4. The radio frequency module according to claim 3, wherein a first wiring that connects the first external connection terminal and the second external connection terminal has a linear shape and is formed on the module substrate.

5. The radio frequency module according to claim 3, wherein the drive level detection circuit and the peak bias control circuit are disposed adjacent to each other in the second integrated circuit.

6. The radio frequency module according to claim 3, wherein the module substrate includes a low-temperature co-fired ceramic (LTCC) substrate.

7. The radio frequency module according to claim 3, wherein the module substrate includes a high-temperature co-fired ceramic (HTCC) substrate.

8. The radio frequency module according to claim 3, wherein the module substrate has a laminated structure.

9. The radio frequency module according to claim 8, wherein the module substrate includes a redistribution layer.

10. The radio frequency module according to claim 2, wherein the second integrated circuit includes a third external connection terminal connected to the peak bias control circuit, and a radio frequency signal input to the radio frequency module is input to the branching circuit through the third external connection terminal.

11. The radio frequency module according to claim 2, further comprising:

a directional coupler connected to the input end of the branching circuit, wherein the second integrated circuit includes a third external connection terminal connected to the peak bias control circuit and the directional coupler.

12. The radio frequency module according to claim 1, further comprising:

a drive level detection circuit connected to the output end of the carrier amplifier and configured to output the signal indicating the drive level of the carrier amplifier, wherein the control circuit includes a peak bias control circuit connected to an input end of the branching circuit or the input end of the carrier amplifier, and the drive level detection circuit, and configured to output a control signal for varying the threshold value of the bias voltage of the peak amplifier to a bias circuit of the peak amplifier.

13. The radio frequency module according to claim 12, further comprising:

a module substrate, wherein the first integrated circuit includes the drive level detection circuit, the first integrated circuit and the second integrated circuit are disposed on a main surface of the module substrate, and in a plan view of the module substrate, the drive level detection circuit is disposed between the carrier amplifier and the second integrated circuit.

14. The radio frequency module according to claim 1, further comprising:

a module substrate, wherein the first integrated circuit and the second integrated circuit are disposed on a main surface of the module substrate, and in a plan view of the module substrate, the second integrated circuit is disposed closer to the peak amplifier than the carrier amplifier.

15. The radio frequency module according to claim 1, wherein the first integrated circuit is formed of at least one of GaAs, SiGe, and GaN.

16. The radio frequency module according to claim 1, wherein the second integrated circuit is formed of at least one of silicon or a complementary metal oxide semiconductor (CMOS).

17. A radio frequency module comprising:

a carrier amplifier and a peak amplifier;

a branching circuit connected to an input end of the carrier amplifier and an input end of the peak amplifier;

a synthesis circuit connected to an output end of the carrier amplifier and an output end of the peak amplifier; and a control circuit configured to vary a threshold value of a bias voltage of the peak amplifier, wherein a first input end of the control circuit is connected to the input end of the carrier amplifier, a second input end of the control circuit is connected to a bias circuit of the carrier amplifier, an output end of the control circuit is connected to a bias circuit of the peak amplifier, the carrier amplifier and the peak amplifier are included in a first integrated circuit, the control circuit is included in a second integrated circuit, and the second integrated circuit is disposed adjacent to the first integrated circuit on a peak amplifier side.

18. The radio frequency module according to claim 17, further comprising:

a module substrate, wherein the first integrated circuit and the second integrated circuit are disposed on a main surface of the module substrate, and in a plan view of the module substrate, the second integrated circuit is disposed closer to the peak amplifier than the carrier amplifier.

19. A radio frequency module comprising:

a carrier amplifier and a peak amplifier;

a branching circuit connected to an input end of the carrier amplifier and an input end of the peak amplifier;

a synthesis circuit connected to an output end of the carrier amplifier and an output end of the peak amplifier; and a control circuit, wherein a first input end of the control circuit is connected to an input end of the branching circuit or the input end of the carrier amplifier, a second input end of the control circuit is connected to the output end of the carrier amplifier, an output end of the control circuit is connected to the peak amplifier, the carrier amplifier and the peak amplifier are included in a first integrated circuit, the control circuit is included in a second integrated circuit, and the second integrated circuit is disposed adjacent to the first integrated circuit on a peak amplifier side.

20. The radio frequency module according to claim 19, further comprising:

a module substrate, wherein the first integrated circuit and the second integrated circuit are disposed on a main surface of the module substrate, and in a plan view of the module substrate, the second integrated circuit is disposed closer to the peak amplifier than the carrier amplifier.

* * * * *